US008679369B2

(12) United States Patent
Ohmi et al.

(10) Patent No.: US 8,679,369 B2
(45) Date of Patent: Mar. 25, 2014

(54) FILM-FORMING MATERIAL AND METHOD FOR PREDICTING FILM-FORMING MATERIAL

(75) Inventors: Tadahiro Ohmi, Miyagi (JP); Shozo Nakayama, Aichi (JP); Hironori Ito, Aichi (JP)

(73) Assignee: Tohoku University, Miyagi (JP)

( * ) Notice: Subject to any disclaimer, the term of this patent is extended or adjusted under 35 U.S.C. 154(b) by 0 days.

(21) Appl. No.: 13/556,193

(22) Filed: Jul. 23, 2012

(65) Prior Publication Data

US 2013/0189423 A1    Jul. 25, 2013

Related U.S. Application Data

(62) Division of application No. 11/991,474, filed as application No. PCT/JP2006/316925 on Aug. 29, 2006, now abandoned.

(30) Foreign Application Priority Data

Sep. 6, 2005    (JP) .................................. 2005-257788

(51) Int. Cl.
*H01B 1/00*    (2006.01)

(52) U.S. Cl.
USPC ............ 252/500; 313/337; 427/8; 427/248.1; 427/255.23; 702/22; 702/69

(58) Field of Classification Search
USPC .............. 252/500; 313/248.1, 337; 427/69, 8, 427/248.1, 255.23; 702/22, 69
See application file for complete search history.

(56) References Cited

U.S. PATENT DOCUMENTS

| | | | |
|---|---|---|---|
| 5,185,181 | A | 2/1993 | Mikami et al. |
| 6,337,102 | B1 | 1/2002 | Forrest et al. |
| 2001/0002279 | A1 | 5/2001 | Forrest et al. |
| 2001/0009348 | A1 | 7/2001 | Choi et al. |
| 2003/0054099 | A1 | 3/2003 | Jurgensen et al. |

FOREIGN PATENT DOCUMENTS

| | | |
|---|---|---|
| CN | 1226079 A | 8/1999 |
| EP | 0935284 A1 | 8/1999 |
| EP | 1 879 431 A1 | 1/2008 |
| JP | 2001-523768 A | 11/2001 |
| JP | 2004-079904 A | 3/2004 |
| JP | 2005-060767 | 3/2005 |
| JP | 2006-291258 A | 10/2006 |
| KR | 10-2001-0024652 A | 3/2001 |
| KR | 10-0315123 B | 7/2001 |

OTHER PUBLICATIONS

Donald M. Mattox, Vacuum Evaporation and Vacuum Deposition, Handbook of Physical Vapor Deposition (PVD) Processing, 1998, pp. 260-267.
M. Otani, "Tetsu Yakin Netsurikigaku", second edition, The Nikkan Kogyo Shinbun, Ltd., Mar. 25, 1974, pp. 72-74.
Milton Ohering, The Physics and Chemistry of Evaporation, Materials Science of Thin Films, Deposition and Structure, 2002, pp. 97-100, Academic Press.
Office Action issued in KR application No. 10-2008-7006479 with partial English translation; Apr. 1, 2013; 6 pages.

*Primary Examiner* — Khanh Tuan Nguyen
(74) *Attorney, Agent, or Firm* — Foley & Lardner LLP

(57) ABSTRACT

Disclosed is a method for prediction of a film material such as a raw material for organic EL. In the method, a film material having an evaporation rate (V(%)) represented by the formula below can be predicted based on the values of the constant (Ko) and the activation energy (Ea). $V=(Ko/P) \times e^{-Ea/kT}$ wherein Ko represents a constant (%·Torr), P represents a pressure (Torr), Ea represents an activation energy (eV), k represents a Boltzmann constant, and T represents an absolute temperature.

4 Claims, 13 Drawing Sheets

FILM-FORMING MATERIAL AND METHOD FOR PREDICTING FILM-FORMING MATERIAL

TECHNICAL FIELD

This invention relates to a film-forming material that is formed into a film by a film forming apparatus, its prediction method and analysis method, and a film forming method.

BACKGROUND ART

A method of forming a layer of a predetermined material by evaporating a raw material of the predetermined material is widely used in the manufacture of semiconductor devices, flat panel display devices, and other electronic devices. A description will be given hereinbelow using an organic EL display device as one example of those electronic devices. The organic EL display device having a sufficient brightness and a lifetime of several tens of thousands of hours or more uses an organic EL element being a self-light-emitting element and, thus, since peripheral components such as a backlight are small in number, it can be formed thin, and therefore, it is ideal as a flat panel display device.

The organic EL element constituting such an organic EL display device is required in terms of characteristics as a display device such that, while being a large screen, the element lifetime is long, there is no variation in luminous brightness in the screen and element lifetime, and there is no defect such as, typically, a dark spot. In order to satisfy such requirements, the organic EL film forming technique is quite important.

For example, as a film forming apparatus for uniformly forming an organic EL film on a large substrate of about 20 inches, use is made of an apparatus described in Patent Document 1 (Japanese Unexamined Patent Application Publication (JP-A) No. 2004-79904) or the like. The film forming apparatus of Patent Document 1 aims to achieve uniformity in film thickness on a large substrate by optimally arranging, in a tree fashion, a piping structure inside an injector disposed in the apparatus so as to uniformly disperse a raw material gas on the substrate along with a carrier gas.

Recently, an increase in size of 20 inches or more has also been required for this type of organic EL device. However, in order to respond to such a requirement, it is necessary to overcome various drawbacks peculiar to the organic EL device that is poor in light emitting efficiency and short in lifetime. Herein, since various organic EL films, including a light emitting layer, forming the organic EL device are as extremely thin as several tens of nm as compared with films formed in other display devices, a technique of forming a film on a molecular basis is required and, further, it is also quite important to perform the film formation on the molecular basis with high accuracy.

As a film forming apparatus also applicable to the increase in size of 20 inches or more, the present inventors have proposed, in Japanese Patent Application No. 2005-110760 (Prior Application 1), a film forming apparatus for uniformly and quickly forming a film of each of various organic EL raw materials forming an organic EL device.

The proposed film forming apparatus comprises two raw material containers for vaporizing/evaporating the same organic EL raw material, an ejection vessel for ejecting the organic EL raw material onto a substrate, and a piping system (i.e. flow paths) connecting the raw material containers and the ejection vessel to each other. In this case, when supplying the organic EL raw material to the ejection vessel from one of the raw material containers, the piping system including valves and orifices is switched in mode before the start of the film formation, at the time of the film formation, and at the time of stopping the film formation and the temperature of the piping system is controlled. In this structure, during the time other than the film formation, a gas remaining in the piping system is quickly exhausted and a gas is circulated to the other raw material container.

In the film forming apparatus shown in Prior Application 1, it is possible to prevent contamination due to the gas remaining in the piping system and further to quickly perform the state transition before the start of the film formation, at the time of the film formation, and at the time of stopping the film formation. Since the contamination due to the organic EL material remaining in the piping system can be prevented, the film forming apparatus according to Prior Application 1 can significantly improve the brightness and lifetime of an organic EL device.

However, it has been found out that when the structure shown in Prior Application 1 is employed, it is necessary to further improve the use efficiency of the organic EL material forming a light emitting layer or the like of an organic EL device and, for a further increase in size of an organic EL device, it is necessary to further improve the brightness of an organic EL element and to achieve an increase in lifetime of the organic EL element.

Further, in the film forming apparatus shown in Prior Application 1, the evaporated organic EL material is blown into the ejection vessel from one of the raw material containers during the film formation, but is exhausted to the exterior from the one of the raw material containers during the time other than the film formation. In this manner, the organic EL material is effectively used only during the film formation but is not effectively used during the time other than the film formation and, therefore, there has also been found out a drawback that the use efficiency of the using organic EL material is low.

An explanation will be given here of the characteristics and structure of an organic EL device to be achieved. At first, the organic EL device aimed at by this invention is an organic EL device having a long lifetime of 10000 hours or more and a light emitting efficiency of 100 lm/W or more. To briefly explain the structure of the organic EL device according to this invention, it comprises, on a glass substrate, an anode in the form of a transparent conductive film and a cathode made of Li/Ag or the like and provided so as to face the anode, and a plurality of layers, for example, seven or five organic layers, disposed between the anode and the cathode. Herein, the organic layers are, for example, in the form of an electron injection layer, an electron transport layer, a light emitting layer, a hole transport layer, and a hole injection layer from the cathode side. The light emitting layer comprises, for example, a red light emitting layer, a green light emitting layer, and a blue light emitting layer and, by forming the red light emitting layer, the green light emitting layer, and the blue light emitting layer into a laminated structure in this manner, it is possible to emit white light with high efficiency.

Among the above organic layers, particularly the red light emitting layer, the green light emitting layer, and the blue light emitting layer forming the light emitting layer each have a thickness of about 20 nm and even the electron transport layer and the hole transport layer each have a thickness of about 50 nm. In this manner, the organic layers of the organic EL device are extremely thin as compared with the thicknesses of various films of other semiconductor devices, but, for future, an attempt is made to further reduce the thicknesses of these organic layers. In order to deposit/form an extremely thin organic layer with high accuracy, there is required an ultraprecise technology for forming a raw material of an organic layer on a molecular basis. Consequently, this means that contamination even on a molecular basis is not allowed for formation of an organic layer.

Patent Document 1: Japanese Unexamined Patent Application Publication (JP-A) No. 2004-79904

DISCLOSURE OF THE INVENTION

Subject to be Solved by the Invention

In the meantime, in the manufacture of organic EL devices currently put to practical use, a deposition method has been used that evaporates an organic EL material by heating it to 200 to 300° C. at a pressure of 10E-4 ($10^{-4}$) to 10E-5 ($10^{-5}$) Torr and deposits the dispersed material onto a substrate. In the present situation, organic EL materials used in these organic EL devices are not fully open to the public about their compositions, characteristics, and so on and, further, it is difficult to analyze these organic EL materials, and therefore, experiments and studies are conducted only relying on specifications from the maker side. However, in the circumstances where the organic EL materials for film formation are not specified as described above, there are those instances where it is not possible to judge whether or not the intended film formation has been obtained, which thus has been a hindrance to the experiments and studies.

Further, the situation has been such that even in the apparatus shown in Prior Application 1 that transports an evaporated organic EL material using a carrier gas to thereby form a film on a substrate, no analysis is made as to what material is suitable for the apparatus.

It is an object of this invention to provide an analysis method for deriving from experimental data a value of a parameter that defines a characteristic of a film-forming material, a prediction method for predicting a film-forming material based on this parameter, and a film forming method using this parameter.

It is another object of this invention to provide a film-forming material determined by a value of a parameter.

Means for Solving the Subject

According to a first aspect of this invention, there is provided a film-forming material having an evaporation rate V (%) represented by:

$$V=(Ko/P) \times e^{-Ea/kt}$$

(where Ko is a constant (%·Torr), P is a pressure (Torr), Ea is an activation energy (eV), k is a Boltzmann constant, and T is an absolute temperature), said film-forming material characterized by being identified by a value of said constant Ko and a value of said activation energy Ea.

According to a second aspect of this invention, there is provided a film-forming material according to the first aspect, characterized in that said activation energy Ea is obtained from a characteristic representing a material concentration in a carrier gas when the temperature T is changed in the state where the pressure P is constant, and said constant Ko is determined from a specific material concentration at a specific temperature.

According to a third aspect of this invention, there is provided a film-forming material according to the first or the second aspect, characterized in that said constant Ko is in a range of $5.700 \times 10^{14}$(%·Torr) to $6.220 \times 10^{14}$(%·Torr).

According to a fourth aspect of this invention, there is provided a film-forming material according to the first or the second aspect, characterized in that said constant Ko is in a range of $2.600 \times 10^{11}$(%·Torr) to $3.640 \times 10^{11}$(%·Torr).

According to a fifth aspect of this invention, there is provided a prediction method for predicting an unknown film-forming material, said prediction method characterized by obtaining, from a result of measurement of a material concentration in a carrier gas, an activation energy Ea in a formula:

$$V=(Ko/P) \times e^{-Ea/kT}$$

(where Ko is a constant (%·Torr), P is a pressure (Torr), Ea is an activation energy (eV), k is a Boltzmann constant, and T is an absolute temperature) representing an evaporation rate V (%) of the unknown film-forming material, and further, calculating said constant Ko from a specific material concentration at a specific temperature, thereby predicting the unknown film-forming material from a value of said calculated constant Ko.

According to a sixth aspect of this invention, there is provided a film-forming material characterized by having an activation energy Ea and a constant Ko satisfying a formula:

$$V=(Ko/P) \times e^{-Ea/kT}$$

(where Ko is a constant (%·Torr), P is a pressure (Torr), Ea is an activation energy (eV), k is a Boltzmann constant, and T is an absolute temperature) representing an evaporation rate in terms of a concentration V (%) in an atmosphere, wherein the temperature is set to 250° C. to 500° C., the concentration in the atmosphere is set to 0.1% to 10%, and the pressure is set to $10^{-3}$ Torr or more. Herein, the reason for setting the temperature to 250° C. or more is that the temperature is required to be equal to or higher than a temperature necessary for efficient evaporation of the material, and the reason for setting the temperature to 500° C. or less is that no gas supply/control system can withstand higher temperatures. Further, the reason for setting the concentration to 0.1% or more is that film formation cannot be economically carried out at lower concentrations. Preferably, the temperature is set to 300° C. to 450° C.

Preferably, the above-mentioned film-forming material is used in applications in which the material is evaporated and transported by a carrier gas.

According to a seventh aspect of this invention, there is provided a film forming method characterized by evaporating the above-mentioned film-forming material into a carrier gas at a concentration of 0.1% to 10% and transporting said carrier gas to the vicinity of a substrate, thereby forming a film of said film-forming material on said substrate.

According to an eighth aspect of this invention, there is provided an analysis method for a film-forming material that is evaporated in evaporation means and transported to the vicinity of a substrate by a carrier gas so as to be formed into a film on said substrate, wherein said analysis method measures a relationship between a pressure in said evaporation means and a concentration of said film-forming material in said carrier gas while a temperature for evaporating said film-forming material is kept constant, and makes a first judgment as to whether or not x and y are substantially in a proportional relationship given that an inverse number of said pressure is x and said concentration is y, measures a relationship between said concentration and said temperature while the pressure in said evaporation means is kept constant, and makes a second judgment as to whether or not a slope of a graph representing the relationship between said concentration and said temperature in an x-y plane is substantially constant regardless of said pressure given that an inverse number of said temperature is x and a logarithm of said concentration is y, and when said first judgment and said second judgment are both positive, makes a judgment based on the fact that the concentration of said film-forming material in said carrier gas is represented by a formula:

$$V=(Ko/P) \times e^{-Ea/kT}$$

(where V is a concentration (%), Ko is a constant (%·Torr), P is a pressure (Torr), Ea is an activation energy (eV), k is a Boltzmann constant, and T is an absolute temperature).

According to a ninth aspect of this invention, there is provided an analysis method for a film-forming material that is evaporated in evaporation means and transported to the vicinity of a substrate by a carrier gas so as to be formed into a film on said substrate, wherein, given that a concentration of said film-forming material in said carrier gas is represented by a formula:

$$V=(Ko/P) \times e^{-Ea/kT}$$

(where V is a concentration (%), Ko is a constant (%·Torr), P is a pressure (Torr), Ea is an activation energy (eV), k is a Boltzmann constant, and T is an absolute temperature), said analysis method identifies Ea in said formula (1) from a relationship between the temperature for evaporating said film-forming material and said concentration while the pressure in said evaporation means is kept constant, and calculates Ko from a value of said Ea, the pressure in said evaporation means, and said concentration.

According to a tenth aspect of this invention, there is provided a film forming method for evaporating a film-forming material in evaporation means and transporting said evaporated film-forming material to the vicinity of a substrate by a carrier gas, thereby forming a film on said substrate, said film forming method characterized in that:

given that a pressure in said evaporation means is P, a temperature for evaporating said film-forming material is T, and a concentration of said film-forming material in said carrier gas is V, a value of one of P, T, and V is determined based on values of the other two and a formula:

$$V=(Ko/P) \times e^{-Ea/kT}$$

(where V is a concentration (%), Ko is a constant (%·Torr), P is a pressure (Torr), Ea is an activation energy (eV), k is a Boltzmann constant, and T is an absolute temperature).

Although examples of organic EL film forming apparatuses will be described hereinbelow, it is needless to say that this invention is not limited thereto at all and can be applied to various film forming apparatuses.

Effect of the Invention

In this invention, it is possible to provide a film-forming material suitable for film formation using a carrier gas. Further, there are provided an analysis method for deriving from experimental data a value of a parameter that defines a characteristic of a film-forming material, a prediction method for predicting a film-forming material based on this parameter, and a film forming method using this parameter.

BEST MODE FOR CARRYING OUT THE INVENTION

Figure 1:
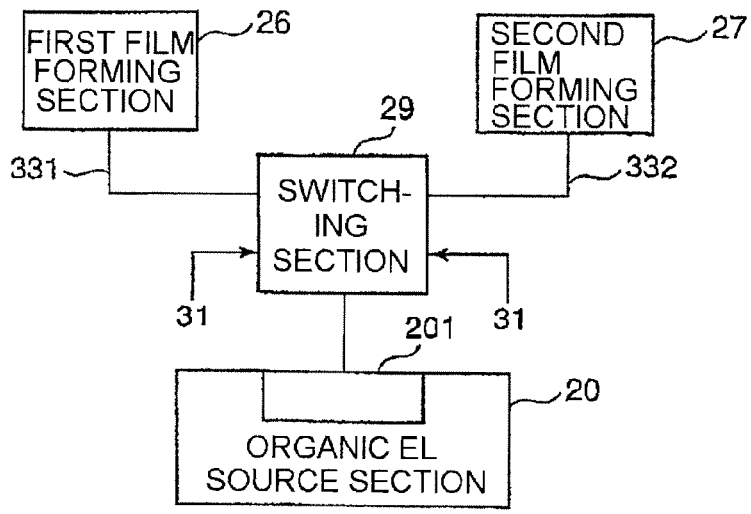
FIG. 1 is a schematic structural diagram showing one example of a film forming apparatus suitable for film formation using a material of this invention.

Referring to FIG. 1, a film forming apparatus according to a first embodiment of this invention is schematically illustrated. The illustrated film forming apparatus comprises an organic EL source section 20 having a plurality of organic EL sources, first and second film forming sections 26 and 27, and a switching section 29 (switching means) for supplying an evaporated organic EL material from the organic EL source section 20 selectively to the first and second film forming sections 26 and 27. The switching section 29 comprises piping, orifices, mass controllers (flow control systems), valves, and so on. In this connection, the switching section 29 is controlled by a controller (not shown) that controls the valves, the orifices, the flow control systems, and the valves.

Specifically, the illustrated organic EL source section 20 has container sections (hereinafter referred to as raw material container sections) containing organic EL raw materials corresponding to the number of organic EL films to be deposited. For example, in the case of three kinds of organic EL raw materials to be deposited on a glass substrate, the organic EL source section 20 includes three raw material container sections containing the three kinds of organic EL raw materials, respectively. In the case of depositing more kinds of organic EL raw materials, there are provided raw material container sections, containing the organic EL raw materials, corresponding to the number of those raw materials. For example, in the case where organic EL films to be deposited are six layers including an electron transport layer, a red light emitting layer, a green light emitting layer, a blue light emitting layer, an electron blocking layer, and a hole transport layer, six raw material container sections containing raw materials for forming the respective layers are provided in the organic EL source section 20.

Further, in each raw material container section 201 of the organic EL source section 20, there are provided not only an evaporating jig (i.e. an evaporating dish) containing the organic EL raw material for evaporation thereof, but also a heater for heating the organic EL material in the evaporating jig. A carrier gas such as argon, xenon, or krypton is introduced into the evaporating jig of each raw material container section 201 through valves, a flow control system, and a piping system.

Herein, in each raw material container section 201, the carrier gas is introduced and heating is carried out by the heater and, as a result of this, the organic EL material in the evaporating jig is evaporated. Therefore, each raw material container section 201 has a function as evaporation means for evaporating the organic EL material. In the figure, only the single raw material container section 201 is shown in the organic EL source section 20 for simplification of description, but the organic EL source section 20 is further provided with the raw material container sections corresponding to the other organic EL raw materials. In this manner, each raw material container section operates as evaporation means for evaporating the organic EL raw material.

On the other hand, the switching section 29 is provided corresponding to the illustrated raw material container section 201 and, although the same switching sections are provided for the other raw material container sections, respectively, illustration thereof is omitted here for simplification. Carrier gas piping systems 31 (piping, valves, flow control systems, orifices, etc) each for supplying a gas of the same kind as the carrier gas such as argon, xenon, or krypton to the switcher 29 are connected to the switching section 29 and, herein, are provided in one-to-one correspondence with the first and second film forming sections 26 and 27. This carrier gas piping system 31 is operated as carrier gas supply means for supplying the carrier gas to gas ejection means not through the evaporation means.

The illustrated switching section 29 comprises a piping system including therein piping, valves, orifices, flow control systems, and so on and supplies the carrier gas and the evaporated organic EL raw material selectively to the first and second film forming sections 26 and 27.

The first and second film forming sections 26 and 27 have the same structure as each other and, as will be described later, are respectively connected to the switcher 29 through piping systems 331 and 332 having portions with the same piping path length as each other. A description will be given assuming that the illustrated first and second film forming sections 26 and 27 eject and deposit an organic EL raw material evaporated in the illustrated raw material container section 201. However, when depositing a plurality of organic EL raw materials in the first and second film forming sections 26 and 27, respectively, it is actually necessary to provide a plurality of switchers between a plurality of raw material container sections and the first and second film forming sections 26 and 27 and to provide piping systems (gas flow paths) for connection between the plurality of raw material container sections and the first and second film forming sections 26 and 27 through those switchers.

Each of the first and second film forming sections 26 and 27 comprises an ejection vessel configured to uniformly eject a carrier gas containing the evaporated organic EL raw material onto a glass substrate and a conveyor for conveying the glass substrate on a stage maintained at a constant temperature and operates to eject the carrier gas containing the evaporated organic EL raw material onto the glass substrate from the ejection vessel to thereby deposit an organic EL film thereon. Therefore, the ejection vessel can be called gas ejection means. As is also clear from this, the illustrated film forming apparatus has a plurality of gas ejection means for one evaporation means.

The ejection vessel comprises supply ports arranged such that the organic EL material from the piping system 331, 332 is uniformly dispersed, and a filter for guiding the organic EL material to the glass substrate or the like. The filter may be replaced with a shower plate in the form of a ceramic or metal plate formed with fine holes.

Hereinbelow, the operation of the film forming apparatus shown in FIG. 1 will be described. At first, an organic EL raw material (organic EL molecules) is evaporated by heating at the raw material container section 201. In this state, when the first film forming section 26 is selected by the switching section 29, the organic EL material from the raw material container section 201 is supplied to the first film forming section 26 through the piping system of the switching section 29 and through the piping system 331 in the evaporated state along with the carrier gas. While the organic EL raw material is supplied to the first film forming section 26, the piping system 332 connected to the second film forming section 27 is closed. While film formation is performed in the first film forming section 26, a glass substrate is supplied to an inlet of the second film forming section 27 so that the second film forming section 27 is in a film formation standby state.

When deposition of the organic EL raw material is finished in the first film forming section 26, the organic EL raw material from the raw material container section 201 is supplied to the second film forming section 27 through the piping system 332 due to switching of the piping system by the switcher 29. While film formation is performed in the second film forming section 27, the glass substrate finished with the film formation in the first film forming section 26 is guided by the conveyor to another ejection vessel provided in the first film forming section 26 for forming a film of another organic EL raw material, so that the film formation is carried out using this other organic EL raw material. In other words, different substrates are supplied at different timings to a plurality of gas ejection means corresponding to one evaporation means.

Subsequently, in the same manner as described above, the first and second film forming sections 26 and 27 are controlled to be switched therebetween at the timings determined by the switcher 29 and organic EL raw materials to be deposited are switched in order, so that organic EL films necessary for an organic EL device are deposited on each of the glass substrates moving in parallel.

Herein, the piping system 332 between the switcher 29 and the second film forming section 27 has a length equal to that of the piping system 331 between the switcher 29 and the first film forming section 26 and a piping tree is formed so that film formation is performed under the same conditions. Further, the piping systems 331 and 332 are controlled so that the organic EL raw material is supplied to the first and second film forming sections 26 and 27 at the same flow rate. As a result of this, in the first and second film forming sections 26 and 27, film formation of the same organic EL raw material is selectively carried out under the same conditions.

Therefore, according to this structure, when film formation is finished in one of the film forming sections 26 and 27, film formation can also be performed in the other of the film forming sections 26 and 27 under entirely the same conditions. Further, while a glass substrate finished with film formation is moving in one of the film forming sections 26 and 27, switching is made to the other of the film forming sections 26 and 27 so that the organic EL raw material is supplied to the film forming section after the switching under the same conditions as the one of the film forming sections. Accordingly, the film forming apparatus shown in FIG. 1 can form in order organic EL material films on a plurality of glass substrates in a simultaneous parallel fashion and utilize the organic EL raw material from the raw material container section 201 without waste, thus making it possible to largely improve the use efficiency of the organic EL raw material.

Figure 2:
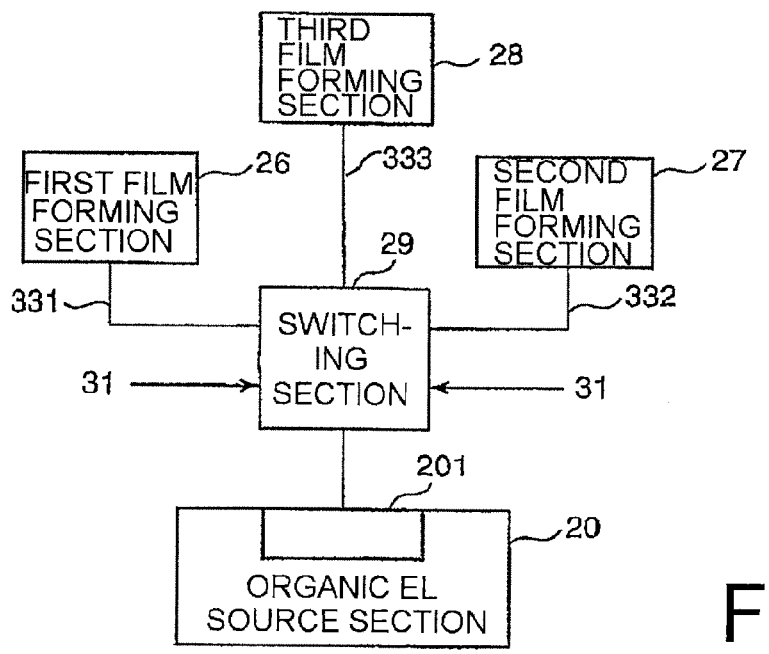
FIG. 2 is a schematic structural diagram showing another example of a film forming apparatus suitable for film formation using a material of this invention.

Referring to FIG. 2, there is shown a conceptual diagram of a film forming apparatus according to a second embodiment of this invention. The illustrated example differs from the film forming apparatus of FIG. 1 in that an organic EL raw material from an organic EL source section 20 is individually supplied to three film forming sections, i.e. first to third film forming sections 26 to 28, through a switcher 29, while it is supplied only to the two film forming sections 26 and 27 in the film forming apparatus of FIG. 1. In the illustrated example, the third film forming section is connected to the switcher 29 through a piping system 333 and the piping system 333 is controlled in the same manner as the other piping systems 331 and 332.

At any rate, in the film forming apparatus shown in FIG. 2, an evaporated organic EL raw material from each raw material container section 201 is selectively supplied to the first to third film forming sections 26 to 28 through a switcher 29.

Figure 3:
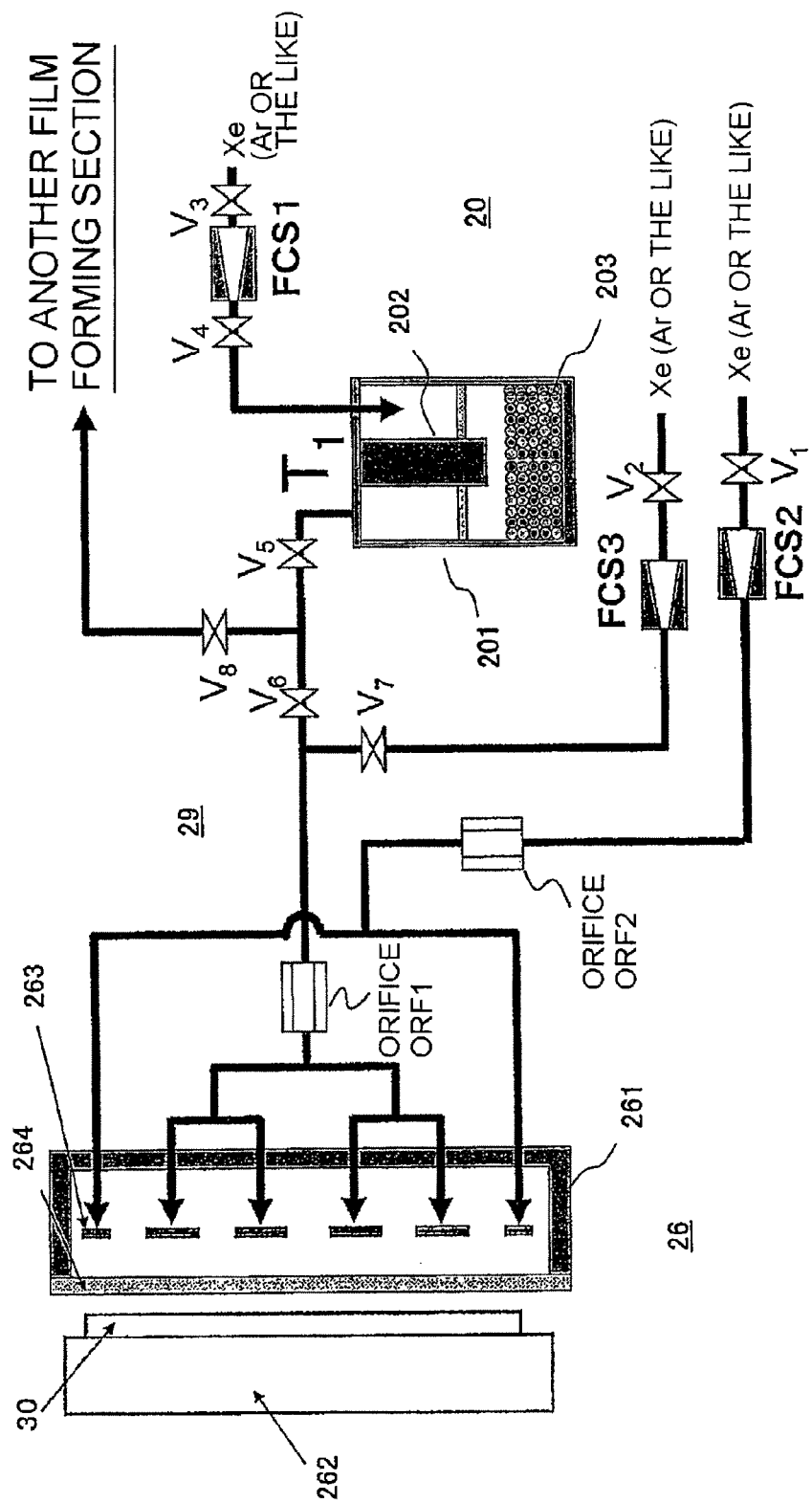
FIG. 3 is a diagram for more specifically explaining a piping system, a switcher, and a film forming section of the film forming apparatus shown in FIG. 1 or 2.

Referring to FIG. 3, there is shown a portion of the film forming apparatus shown in FIG. 1 or 2, wherein the connection relationship among the organic EL source section 20, the switcher 29, and the single film forming section 26 is shown along with a partial structure of the inside of the film forming section 26. The film forming section 26 shown in FIG. 3 comprises an ejection vessel 261 for ejecting a carrier gas containing an organic EL raw material (molecules) in the film forming section 26 and a stage 262 supporting a glass substrate 30. In the state where the glass substrate 30 is mounted thereon, the stage 262 is movable, for example, in a direction perpendicular to the sheet surface of FIG. 3. Further, inside the ejection vessel 261, gas dispersion plates 263 are provided in the number of six in this example and a filter 264 (or a shower plate) made of metal or ceramic is disposed at a position facing the glass substrate 30. Supply ports are provided corresponding to the gas dispersion plates and both are arranged in a row in the same direction (vertical direction on the sheet surface of FIG. 3). The filter 264 has a shape extending in the arranging direction of the supply ports and the gas dispersion plates. The inside of the illustrated film forming section 26 is maintained at a pressure of about 5 to 30 mTorr and the stage 262 is maintained at room temperature.

Herein, the filter 264 is preferably made of a porous ceramic. Generally, when the filter 264 made of the porous ceramic is used, a fluid in the form of a gas or a liquid can be uniformly supplied onto a large-area substrate at a predetermined angle.

On the other hand, the illustrated organic EL source 20 is featured by a single raw material container section 201, wherein the illustrated raw material container section 201 is connected to upstream piping and downstream piping. The upstream piping is piping for introducing a carrier gas into the raw material container section 201 and, as illustrated, includes a flow control system (FCS1) and valves V3 and V4 provided before and after the flow control system FCS1. The downstream piping forms part of the switcher 29.

The raw material container section 201 is divided into an upstream region and a downstream region by a vertically extending partition 202 and an evaporating portion 203 filled with an organic EL raw material is provided under the partition 202. Further, as described before, the raw material container section 201 is provided with a heater (not shown).

In this structure, the carrier gas introduced through the upstream piping is led into the evaporating portion 203 through the upstream region of the raw material container section 201, so that the organic EL raw material (molecules) evaporated in the evaporating portion 203 due to heating by the heater is, along with the carrier gas, led out into the downstream piping through the downstream region of the raw material container section 201.

Like in FIGS. 1 and 2, the switcher 29 is connected to the raw material container section 201. The switcher 29 shown in FIG. 3 comprises a piping system establishing connection between the plurality of film forming sections 26, 27, etc. and the organic EL source section 20 (i.e. the raw material container section 201) and a piping system for supplying a carrier gas to the film forming section 26.

Specifically, a piping system of the switcher 29 establishing connection between the raw material container section 201 and the ejection vessel 261 of the film forming section 26 comprises a first piping system including valves V5 and V6 and an orifice ORF1 and extending to the supply ports corresponding to the four gas dispersion plates 263 provided in the ejection vessel 261 and a second piping system directly leading an externally provided carrier gas source (not shown) of xenon, argon, or the like to the two gas dispersion plates 263 of the ejection vessel 261. The second piping system reaches the supply ports corresponding to the gas dispersion plates 263 of the ejection vessel 261 through a valve V1, a flow control system FCS2, and an orifice ORF2. Further, a third piping system for introducing a gas of the same kind as the carrier gas from the exterior is connected to the first piping system between the orifice ORF1 and the valve V6. This third piping system includes a valve V2, a flow control system FCS3, and a valve V7. Further, a fourth piping system for supplying the evaporated organic EL raw material to another film forming section (e.g. 27 in FIG. 1) is connected to the first piping system between the valves V5 and V6. This fourth piping system includes a valve V8. Each of the orifices ORF1, 2, and 3 illustrated in the figure is operated as a gas pressure adjusting portion having an orifice and a valve for adjusting/controlling a gas pressure. Therefore, it is understood that the illustrated film forming apparatus has a structure such that the gas pressure adjusting portion is provided between the evaporation means and the ejection vessel, and the gas pressure adjusting portion and the supply ports of the ejection vessel are connected to each other by the piping.

Herein, if, in the first piping system for supplying the carrier gas containing the organic EL raw material (molecules) to the ejection vessel 261, the lengths of the piping between the orifice ORF1 and the supply ports of the ejection vessel 261 are all set equal to each other, it is possible to supply the organic EL raw material (molecular gas) so as to reach the glass substrate 30 uniformly and simultaneously. In this connection, in the illustrated example, the number of the organic EL molecular gas supply ports in the ejection vessel 261 is set to $2^n$, and these supply ports and the orifice ORF1 are connected to each other by the piping branched into $2^n$ paths (n is a natural number). Further, by providing the same piping between the orifice ORF1 and the supply ports of the ejection vessel 261 in each of the plurality of film forming sections, it is possible to uniformly form films of the same organic EL material under the same conditions in the plurality of film forming sections.

Only the carrier gas is supplied to the gas dispersion plates 263 provided at both upper and lower ends in FIG. 3.

Further, the temperature of the first piping system from the raw material container section 201 to the ejection vessel 261 is set higher than the temperature of the raw material container section 201 supplying the organic EL raw material, so as to prevent deposition/adsorption of the organic EL raw material (molecules) on the walls of pipes forming the piping system.

Herein, referring to FIGS. 1 and 3, the operation of the film forming apparatus will be described. At first, the operation of the illustrated film forming apparatus can be classified into operations before the start of film formation, during the film formation, and at the time of stopping the film formation for each of the film forming sections 26 and 27. Herein, a description will be made on the assumption that the operations before the start of the film formation, during the film formation, and at the time of stopping the film formation are a mode 1, a mode 2, and a mode 3, respectively.

In the mode 1 before the start of the film formation for the film forming section 26, the valves V1, V2, V3, V4, and V7 are in the open state, the valve V6 is in the closed state, and the valves V5 and V8 are in the open state. Accordingly, in the mode 1, the carrier gas is supplied into the ejection vessel 261 through the valve V1, the flow control system FCS1, and the orifice ORF2, while the carrier gas flows into the ejection vessel 261 through the valve V2, the flow control system FCS3, the valve V7, and the orifice ORF1. In this state, the pressure in the ejection vessel 261 and the pressure on the glass substrate 30 are controlled at predetermined pressures. In this case, for example, the pressure in the ejection vessel 261 is controlled at 10 Torr and the pressure on the glass substrate is controlled at 1 mTorr.

Further, in the state of the mode 1, since the valves V3 and V4 are in the open state, the carrier gas to be introduced into the raw material container section 201 that supplies the organic EL molecules is introduced into the raw material container section 201 through the path of the valve V3, the flow control system FCS1, and the valve V4 and, since the valve V6 is in the closed state, the organic EL raw material is not fed to the film forming section 26 but is supplied to the other film forming section (e.g. 27) through the valves V5 and V8 in the open state. Naturally, in a mode before the start of the film formation for the entire film forming apparatus, the valves V5 and V8 are also set to the closed state and, therefore, the organic EL raw material is not fed to either of the film forming sections 26 and 27 from the raw material container section 201 and only the gas of the same kind as the carrier gas is fed thereto through the piping systems provided for both film forming sections, respectively.

In FIG. 3, at the start of the film formation, the state of the first film forming portion 26 is shifted from the mode 1 to the mode 2 during the film formation. In the mode 2 during the film formation, the valves V2, V7, and V8 are set to the closed state, while, the valves V1, V3, V4, V5, and V6 are set to the open state. As a result of this, the carrier gas is fed to the upper and lower supply ports of the ejection vessel 261 through V1, the flow control system FCS2, and the orifice ORF2 and, further, the organic EL molecular gas evaporated in the raw material container section 201 is supplied to the four supply ports of the ejection vessel 261 through the path of V5, V6, and the orifice ORF1 by the carrier gas introduced through the path of the valve V3, the flow control system FCS1, and the valve V4.

In this mode 2, the gas (flow rate f1) of the same kind as the carrier gas that was supplied through the valve V2, the flow control system FCS3, the valve V7, and the orifice ORF1 is stopped. On the other hand, in order to keep constant the pressure in the ejection vessel 261 and the pressure in a chamber, it is preferable that the carrier gas flow rate from the raw material container section 201 serving to supply the organic EL molecules to the ejection vessel 261 be, in principle, set equal to the foregoing flow rate f1. That is, the transport gas flow rate in the path of the valves V5 and V6 and the orifice ORF1 is preferably equal to the flow rate f1 of the gas of the same kind as the carrier gas that was fed in the path of the valve V2, the flow control system FCS3, the valve V7, and the orifice ORF1 in the mode 1.

Next, referring to FIG. 3, the mode 3 at the time of stopping the film formation for the first film forming section 26 will be described. When shifting from the state of the mode 2 to the state of the mode 3, the valve V6 is set to the closed state and the valves V5 and V8 are set to the open state and, simultaneously, the valves V2 and V7 are set to the open state. That is, in the mode 3, the valves V1, V2, V3, V4, V5, V7, and V8 are set to the open state, while, the valve V6 is set to the closed state, so that the organic EL raw material from the raw material container section 201 is supplied to the other film forming section (e.g. 27).

In this manner, in the mode 3, since the valves V5 and V8 are set to the open state, the carrier gas containing the organic EL molecules flows from the raw material container section 201 side to the other film forming section at the flow rate f1 in the mode 2. On the other hand, since the valves V2 and V7 are set to the open state, the gas of the same kind as the carrier gas flows into the ejection vessel 261 of the first film forming section 26 through the orifice ORF1 at the flow rate f1 equal to that in the mode 1. By this gas of the same kind as the carrier gas, the organic EL molecules in the piping from the valve V6, which was in the open state in the mode 2, to the ejection vessel 261 are blown off. Therefore, the expelling of the organic EL molecules is extremely fast in the film forming section 26 at the time of stopping the film formation.

Figure 4:
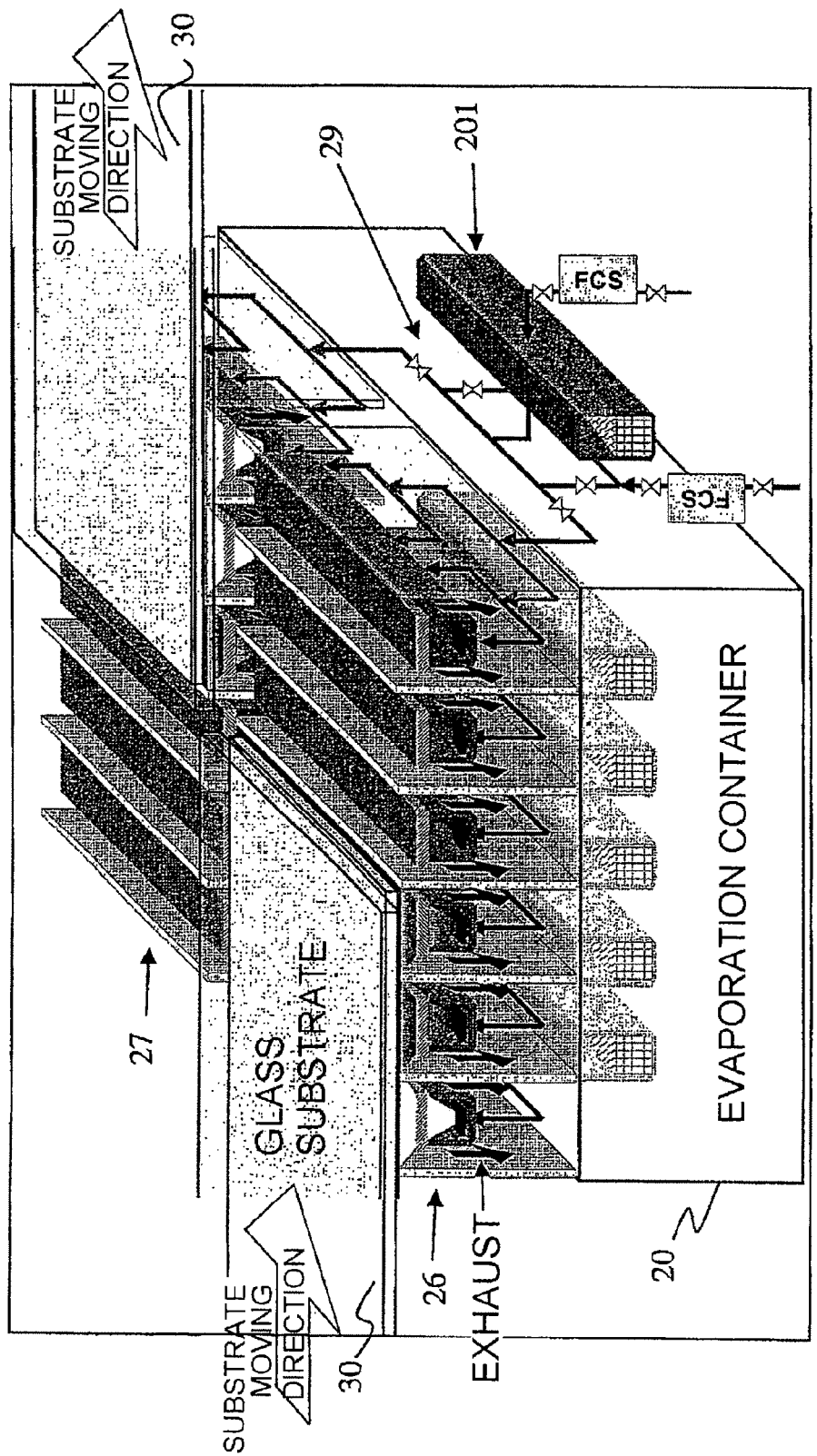
FIG. 4 is a perspective view showing a main portion of still another example of a film forming apparatus suitable for film formation using materials of this invention.

FIG. 4 is a perspective view of a main portion of a film forming system according to another embodiment of this invention. In this embodiment, a film forming section comprises two film forming sections like in the first embodiment, wherein each of the film forming sections 26 and 27 has six ejection vessels. In FIG. 4, the same reference numerals are assigned to portions corresponding to those in the embodiment of FIGS. 1 and 3. The film forming section will be described in detail with reference to FIG. 5. As shown in FIG. 4, in a first film forming section array (chamber CHM1), six ejection vessels each extending to have a length equal to the width of a glass substrate are aligned adjacent to each other to be in parallel to each other in their length directions. A glass substrate 30 moves at a predetermined speed over the group of ejection vessels in a direction crossing the above length direction. A second film forming section array (chamber CHM2) is configured in the same manner and another glass substrate 30 is supplied thereover at a timing different from that over the first array. The ejection vessels disposed in the two arrays form pairs and a carrier gas containing a raw material is supplied to each pair at different timings from the same raw material container section. When the carrier gas containing the raw material is selectively supplied to one of the pair of ejection vessels, the glass substrate is present thereover, while, during that time, the carrier gas containing the raw material is not supplied to the other of the pair of ejection vessels and the glass substrate is also not present thereover. Supply/movement of the glass substrates and selection as to which of the pair of ejection vessels the carrier gas containing the raw material is supplied to are cooperatively performed to determine the timing so that the carrier gas containing the raw material is always supplied to either of the pair and the substrate is present thereover.

Figure 5:
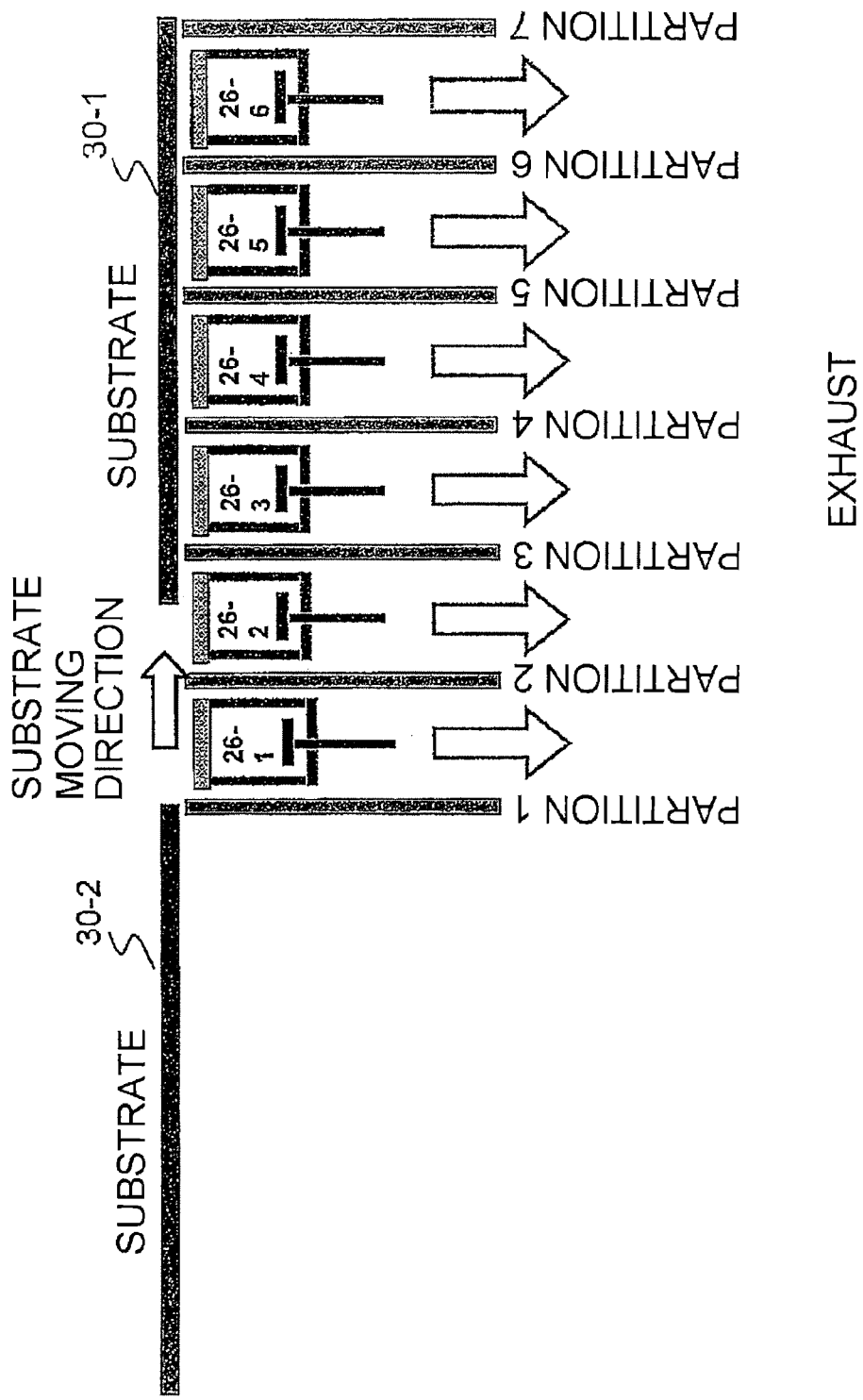
FIG. 5 is a diagram showing a film forming section of the film forming apparatus of FIG. 4.

Referring to FIG. 5, the single film forming section array (chamber) of the film forming system according to the embodiment of FIG. 4 will be described. FIG. 5 shows the single film forming section array for use in manufacturing an organic EL device by forming organic EL films in sequence on a substrate 30 of glass or the like, wherein the films of six layers are formed in sequence on the substrate. In this case, use can be made of a substrate with a size from 730×920 (mm) to 3000×5000 (mm).

The illustrated film forming section array comprises six ejection vessels 26-1 to 26-6 separated by partitions 1 to 7, wherein the ejection vessels eject carrier gases containing organic EL materials onto the glass substrate located above in the order of stacking of the films. These six ejection vessels 26-1 to 26-6 are aligned so that the extending directions of internal filters or shower plates are parallel to each other with respect to the conveying direction of the glass substrates. Glass substrates 30-1 and 30-2 move, with a fixed interval therebetween, over the six ejection vessels from left to right in the figure and are subjected to formation of organic EL films by the organic EL raw materials ejected upward in the figure from respective ejecting portions of the ejection vessels 26-1 to 26-6. In this event, predetermined distances are maintained between the substrate 30-1, 30-2 and each partition and between the substrate 30-1, 30-2 and each of the ejection vessels 26-1 to 26-6, wherein the distance between the substrate 30-1, 30-2 and each partition is smaller than the distance between the substrate 30-1, 30-2 and each of the ejection vessels 26-1 to 26-6. The gases ejected upward from the respective ejection vessels pass through spaces between the side walls of the ejection vessels and the inner surfaces of the partitions so as to be exhausted downward as shown by arrows. The piping system as shown in FIGS. 3 and 4 is connected to each of the ejection vessels. Therefore, the film forming section array (chamber) shown in FIG. 5 is connected to the non-illustrated other film forming section array (chamber) through the respective piping systems. By controlling the respective piping systems of the plurality of film forming section arrays by respective switchers, it is possible to parallelly process glass substrates in two rows.

In the embodiment of FIG. 5, the glass substrate 30-1, 30-2 has a size of 2,160 mm×2,540 mm and moves in its longitudinal direction. The width of an ejection port of each ejection vessel in the glass substrate moving direction is 50 mm, the length of the ejection port perpendicular thereto is 2,170 mm, the width (thickness) of the side wall of each ejection vessel is 15 mm, the distance between the outer surface of the side wall of each ejection vessel and the inner surface of each of the partitions on both sides thereof is 30 mm, thus the distance between the inner surfaces of the adjacent partitions is 140 mm, the thickness of each partition is 15 mm, and the length of the film forming section array (chamber) in the substrate moving direction is 945 mm. The distance between the upper surface of each ejection vessel and the substrate is 20 mm, the distance between each partition and the substrate is 2 mm, and the temperature of each partition and each ejection vessel is set to 350 to 450° C. The pressure of a film forming atmosphere is 30 mTorr and the ejection speed of the carrier gas containing the raw material ejected from the ejecting portion is 3 m/sec, so that the carrier gas containing the raw material reaches the substrate in 0.1 seconds. The ejection flow rate of the carrier gas containing the raw material from each ejection vessel is 317 cc/min in terms of room temperature and the atmospheric pressure. Assuming that the substrate feed speed is 1.0 cm/sec, the time required for the substrate to pass through one ejection vessel is 264 seconds and the time required for the substrate to pass through six ejection vessels is 341.5 seconds. The use efficiency of the organic EL raw materials reaches 90%.

Figure 6:
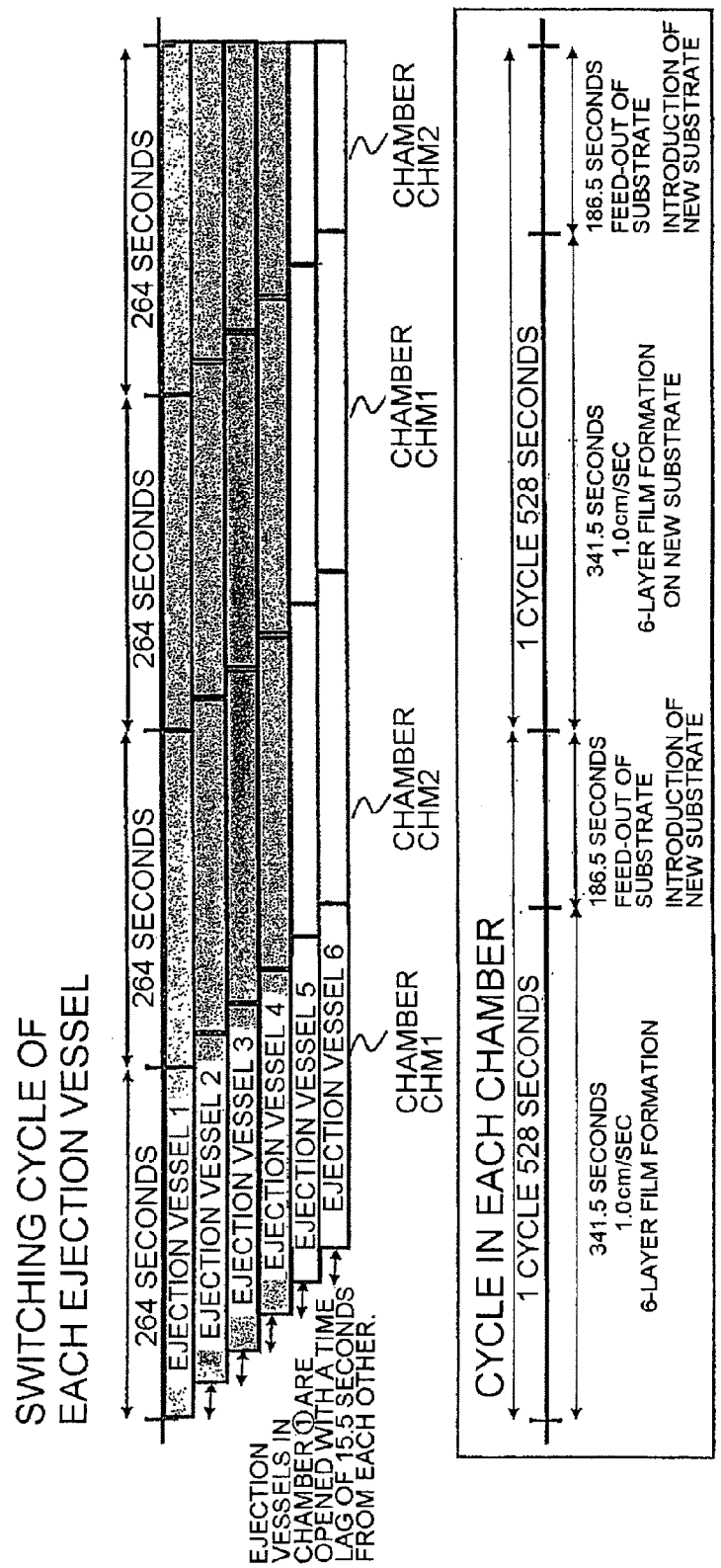
FIG. 6 is a timing chart showing switching timings and so on in the film forming apparatus of FIG. 4.

Referring here to FIG. 6, an upper chart is a timing chart showing a switching cycle between the ejection vessels in pairs arranged separately in the two film forming section arrays (chambers), wherein each ejection vessel is subjected to switching of gas supply per 264 seconds. A lower timing chart shows a cycle of the operation in each chamber, wherein, in each chamber, film formation of six layers is achieved in 341.5 seconds and, for 186.5 seconds thereafter, feed-out of a substrate finished with the film formation from the chamber and introduction of a new substrate into the chamber are carried out, so that one cycle is finished in 528 seconds in total. In this one cycle of 528 seconds (8 minutes and 38 seconds), the film formation of 6 layers on the two substrates is completed.

Referring back to FIGS. 3 to 5, all the ejection vessels are made to have completely the same structure, the same piping system described with reference to FIG. 3 is connected to each of them, and the flow rates of the carrier gas to be supplied thereto are also set to the same value. In this case, the temperature of each ejection vessel may be set so as to match the properties of the organic EL molecules. The film forming rate/thickness is preferably controlled by the temperature of each raw material container section. Further, each ejection vessel is preferably made of a stainless steel and the ejecting portion of each ejection vessel is in the form of a stainless filter and is welded to the body. All the inner surfaces of each ejection vessel are preferably coated with a passive film of $Al_2O_3$ or the like having a low catalytic effect.

Further, in the film forming apparatus according to this invention having the plurality of film forming sections and carrying out the control as described with reference to FIG. 3, the carrier gas flows into the respective film forming sections at completely the same flow rate in either of the modes during the film formation and at the time of stopping the film formation and, therefore, the pressure in the respective ejection vessels forming the respective film forming sections can be maintained constant. This means that cross contamination between the ejection vessels can be prevented.

In the case where the ejection vessels for six layers all have the same size and the flow rates of a carrier gas to be ejected are set to the same value, the concentrations of organic EL raw material molecules in the carrier gas may be set to the same value when the required thicknesses of the respective layers are the same (red light emitting layer, green light emitting layer, blue light emitting layer, electron blocking layer: thickness is 20 to 10 nm for each), while, with respect to the layers with a larger thickness (electron transport layer, hole transport layer: thickness is 50 nm for each), it is necessary to increase the concentration of organic raw material molecules contained in the carrier gas in proportion to the thickness. If this is difficult, it is necessary to take a measure for the layer with the larger thickness to use a plurality of ejection vessels, to increase the opening width of the ejection vessel, to increase the flow rate of the carrier gas, or the like.

Further, as described before, by providing the plurality of film forming sections and temporally switching the modes of these plurality of film forming sections, it is possible to quickly form a plurality of films necessary for an organic EL device and thus to largely improve the throughput and also improve the use efficiency of the organic EL raw materials. For example, in the case of manufacturing an organic EL device by forming organic EL material films of six layers by switching three film forming sections, organic EL devices can be manufactured at intervals of about 6 minutes and, in this case, the use efficiency of the organic EL raw materials can be improved to 82%. As shown in FIGS. 4 to 6, in the case of performing the film formation using the two film forming section arrays, the 6-layer film formation is enabled at intervals of about 8 minutes and the material use efficiency reaches 90%.

Herein, in order to manufacture an organic EL device having the intended characteristics, it is extremely important to keep constant the concentration, in a carrier gas, of an organic EL raw material evaporated from each raw material container section. In other words, if the concentration of the organic EL raw material in the carrier gas changes in a short time, it is impossible to uniformly deposit the organic EL material on a glass substrate or the like on a molecular basis over a long period of time.

When the concentration of an organic EL raw material in a carrier gas is constant, the required concentration is determined as follows. At first, assuming that the molecular weight of organic EL materials of six layers is 500, a molecular layer of each material film has a thickness of 0.7 nm and the number of molecules is $2.0 \times 10E14$ ($10^4$) per cm$^2$. Assuming that the thickness of each of a red light emitting layer, a green light emitting layer, a blue light emitting layer, and an electron blocking layer is 20 nm, the number of molecules of the material required for each layer is about $6 \times 10E15$ ($10^{15}$) per cm$^2$. Since the thickness of each of an electron transport layer and a hole transport layer is 50 nm, $1.4 \times 10E16$ ($10^{16}$) molecules are required per cm$^2$ for each layer. Assuming that the density of a carrier gas flow sprayed onto a glass substrate is $2.58 \times 10E-3$ ($10^{-3}$) cc/sec per cm$^2$, the number density of a gas sprayed onto the surface of the glass substrate is $6.96 \times 10E16$ ($10^{16}$) molecules/sec per cm$^2$. In the foregoing example, since the glass substrate passes over the ejection port with the width of 5 cm at the speed of 1.0 cm/sec, the gas is sprayed onto the respective portions of the substrate for 5 seconds and the number of gas molecules in the carrier gas containing the organic EL molecules for 5 seconds becomes $3.48 \times 10E17$ ($10^{17}$) per cm$^2$. Since about $6 \times 10E15$ ($10^{15}$) organic EL molecules per cm$^2$ should be contained in this gas flow in the case of each of the red light emitting layer, the green light emitting layer, the blue light emitting layer, and the electron blocking layer and $1.4 \times 10E16$ ($10^{16}$) organic EL molecules per cm$^2$ should be contained in this gas flow in the case of each of the electron transport layer and the hole transport layer, it is necessary to set the concentration of the organic EL raw material molecules contained in the carrier gas to about 1.7% for each of the red light emitting layer, the green light emitting layer, the blue light emitting layer, and the electron blocking layer and to about 4% for each of the electron transport layer and the hole transport layer. These concentrations are fully achievable by heating the respective materials at temperatures of 500° C. or less. This concentration required for each layer can be set to a different value by changing the speed, flow rate, and density of the carrier gas flow sprayed onto the glass substrate, the moving speed of the glass substrate, the opening width of the ejecting portion, and so on. Further, the concentration of the organic EL raw material molecules in the carrier gas can be controlled by the heating temperature used for evaporating the material, the pressure at the evaporating portion, and so on.

As a result of this, according to the present film forming system, it is possible to control the film formation with a predetermined thickness quite accurately and at high speed.

Figure 7:
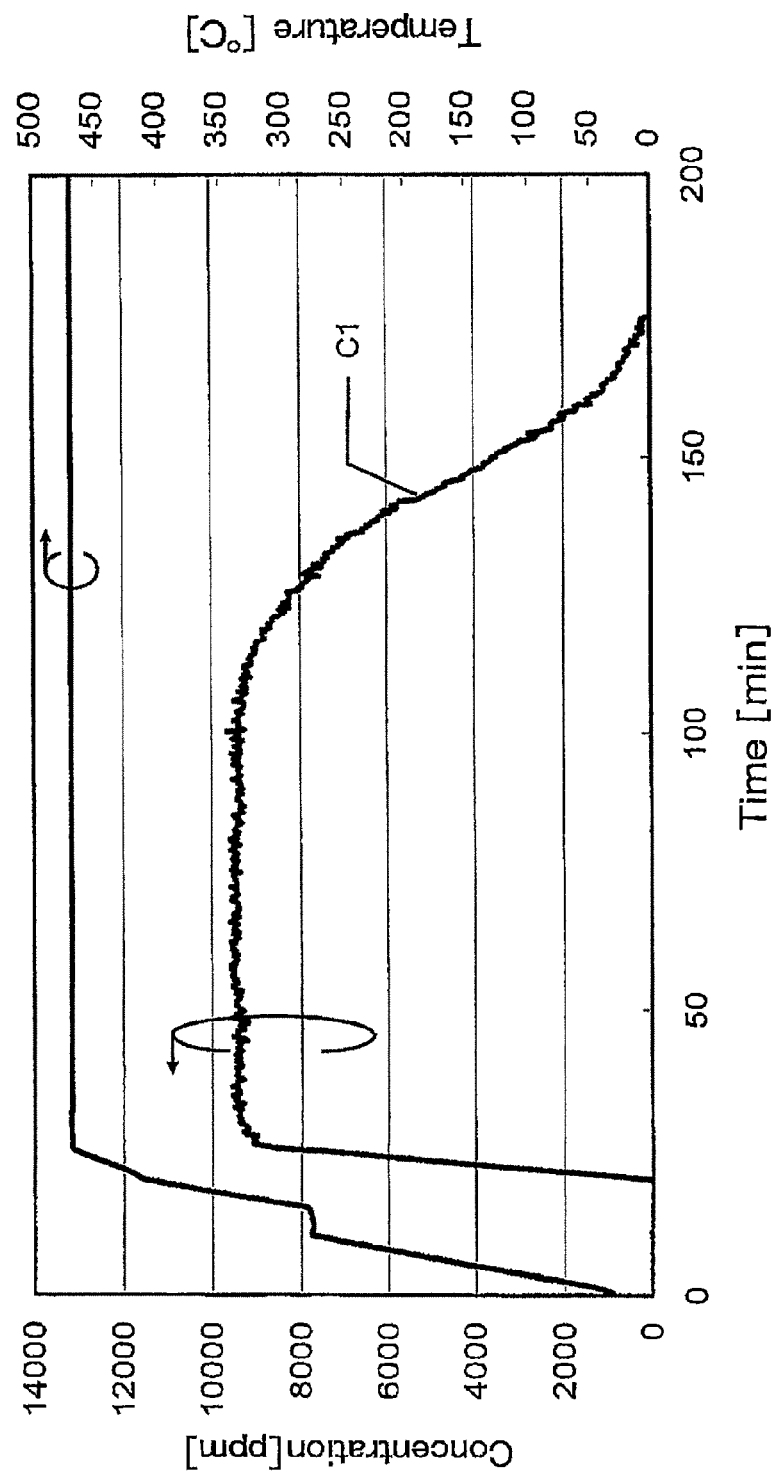
FIG. 7 is a diagram showing experimental results when a material according to this invention was used.

Referring to FIG. 7, the concentration is shown in the case where Ar was used as a carrier gas and use was made of an organic EL raw material known as a material H.

In FIG. 7, a curve C1 shows changes in concentration (left scale) of the material H in the carrier gas when 200 mg of the material H was filled in an evaporating dish, maintained at a temperature of 250° C. for 5 minutes, and then heated to 470° C. (right scale) so as to be evaporated. Further, the experiment was conducted by disposing the evaporating dish in a raw material container section maintained at a pressure of 75 Torr and supplying the carrier gas at a flow rate of 10 sccm into the raw material container section. Herein, it is shown that the concentration can be maintained at 9000 ppm or more for 100 minutes or more. Accordingly, an extremely thin film of the material H can be uniformly formed over a long period of time in a film forming apparatus.

Figure 8:
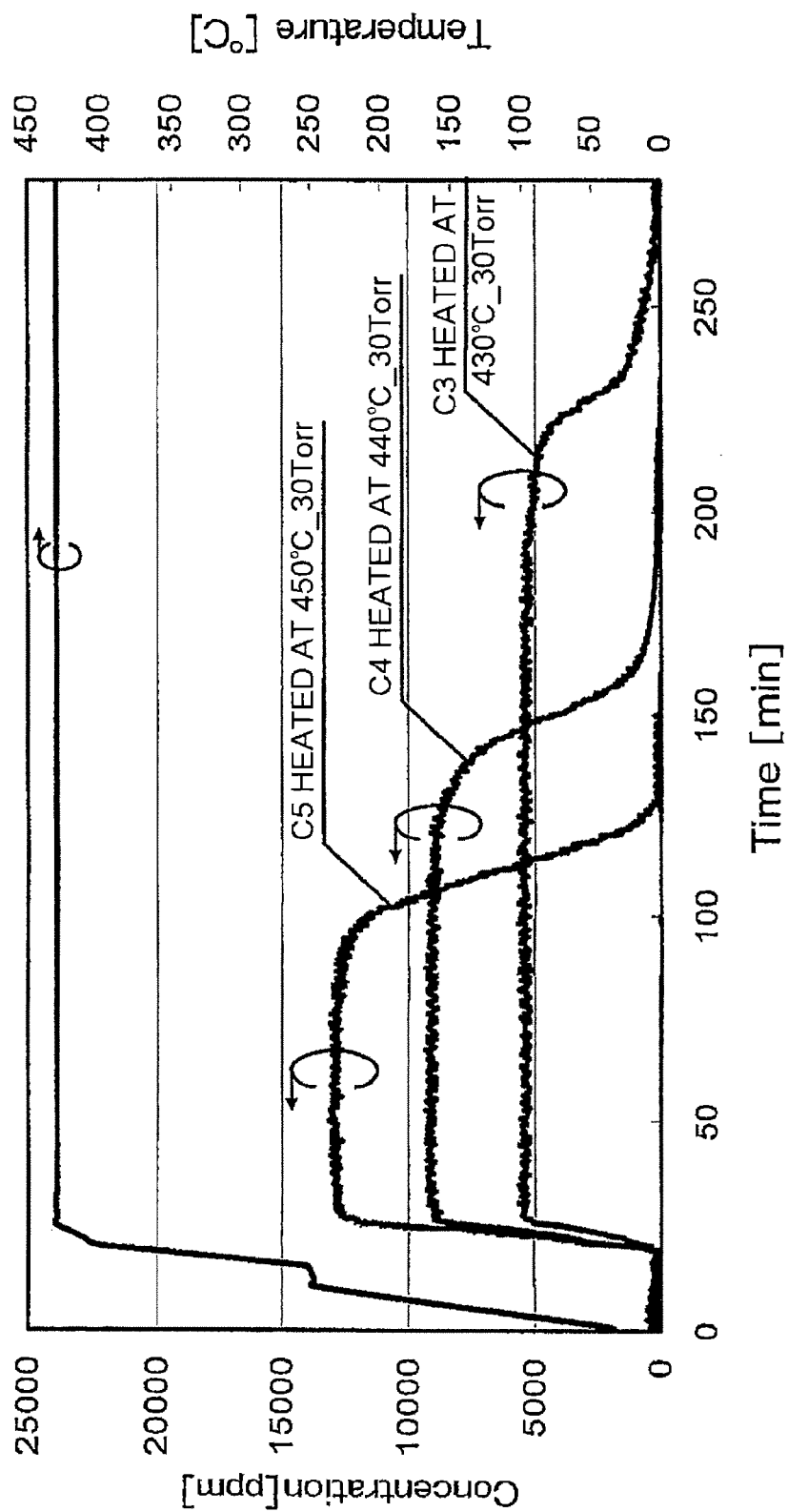
FIG. 8 is a diagram showing the temperature dependence of evaporation behavior of an organic EL raw material (material H) according to this invention, wherein there is shown the temperature dependence in the state where the pressure is kept constant.

FIG. 8 shows the temperature dependence of evaporation behavior of the organic EL raw material (herein, the material H), wherein there are shown changes in concentration of the material H when the temperature for evaporation of the material H was changed in the range of 430° C. to 450° C. in the state where the pressure of raw material container sections was maintained constant (e.g. at 30 Torr). In this example, there is shown the case where 200 mg of the material H was filled in each of evaporating dishes and the carrier gas was supplied at a flow rate of 10 sccm. A curve C3 shown in FIG. 8 shows a characteristic when the evaporating dish was heated at 430° C. in the state where the pressure was maintained at 30 Torr, wherein the concentration can be maintained substantially constant at about 5000 ppm over a long period of time, i.e. until the filled organic EL raw material is exhausted.

On the other hand, a curve C4 shows concentration changes when heated at 440° C. in the state where the pressure was maintained at 30 Torr. Also in this case, it is possible to maintain a concentration of 9000 ppm for 2 hours or more. Further, a curve C5 shows concentration changes when heated at 450° C. in the state where the pressure was maintained at 30 Torr, wherein a concentration of 13000 ppm can be achieved and this concentration can be maintained until substantially all the filled organic EL raw material is evaporated from the evaporating dish.

Figure 9:
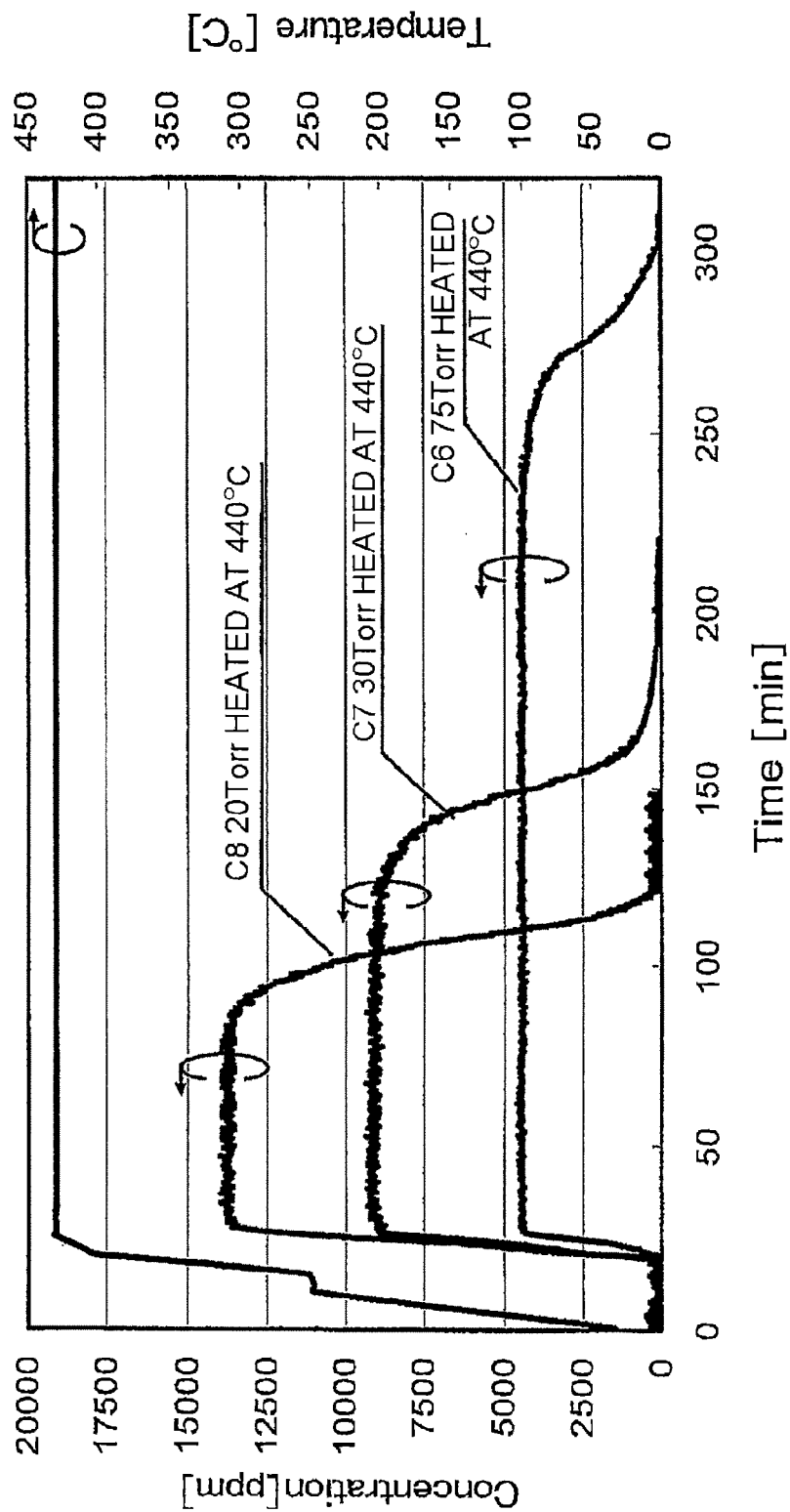
FIG. 9 is a diagram showing the pressure dependence of evaporation behavior of an organic EL raw material (material H) according to this invention, wherein there is shown the pressure dependence in the state where the temperature is kept constant.

Referring to FIG. 9, there are shown the pressure dependence characteristics of evaporation behavior of the material H being the organic EL raw material. In this example, evaporating dishes are maintained at a temperature of 440° C. and Ar is supplied as a carrier gas to the evaporating dishes at a flow rate of 10 sccm. Like in FIGS. 7 and 8, 200 mg of the material H is filled in each evaporating dish. Curves C6, C7, and C8 show evaporation characteristics of the material H in the states where raw material container sections (atmospheres of the evaporating dishes) were maintained at 75 Torr, 30 Torr, and 20 Torr, respectively. As is also clear from these curves C6 to C8, the concentration of the material H in the carrier gas increases as the pressure decreases and, in any of the cases, the concentration of the material H in the carrier gas can be maintained substantially constant.

Figure 10:
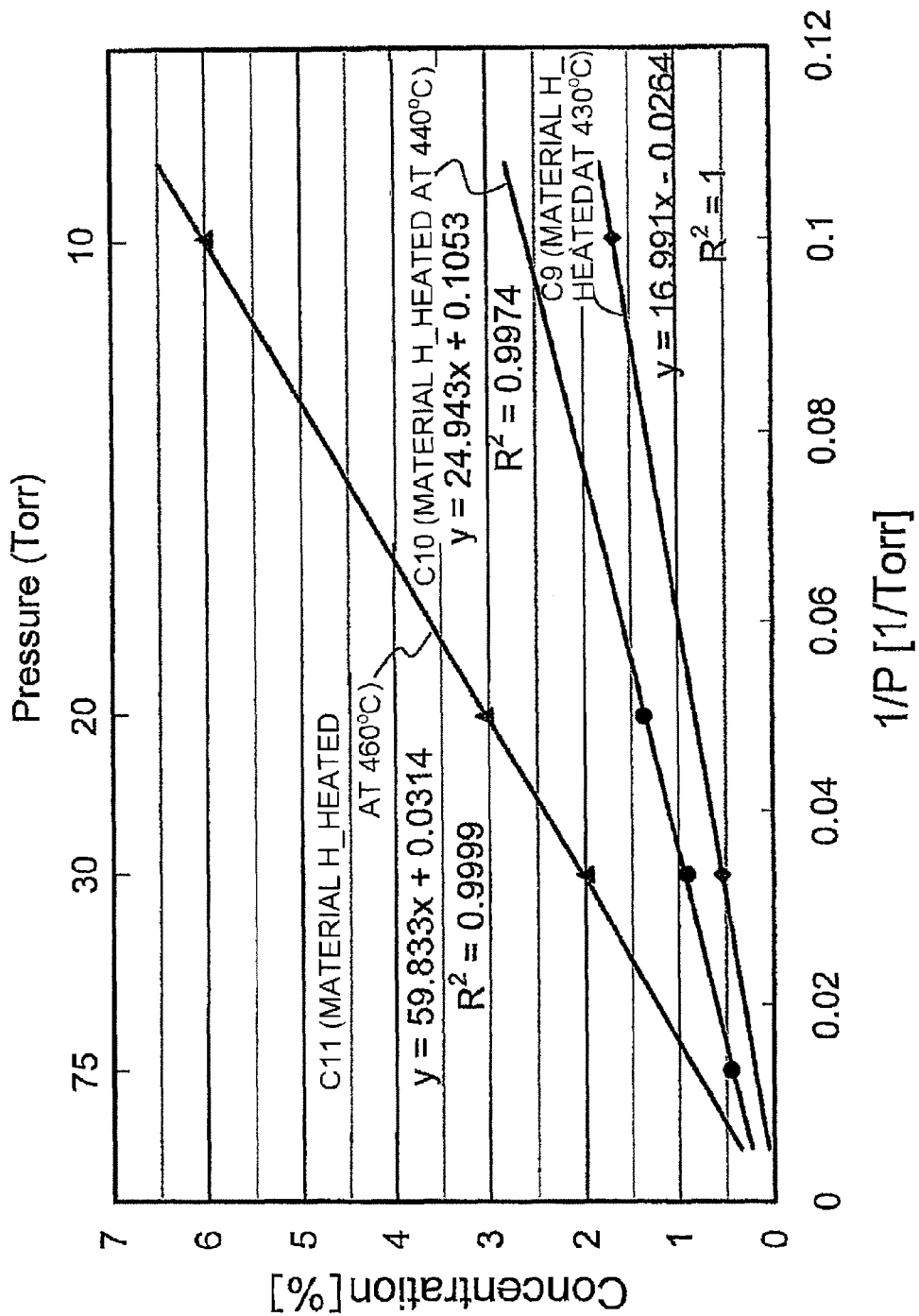
FIG. 10 is a diagram showing the characteristics when a material according to this invention was used, wherein the pressure dependence of the concentration of an organic EL raw material (material H) in a carrier gas is shown in relation to temperature.

Referring to FIG. 10, there is shown the relationship between concentration and pressure in the state where the temperature of each evaporating dish was maintained constant. In FIG. 10, for reference, the upper scale is graduated in Torr and the lower scale is graduated in 1/P (1/Torr). In FIG. 10, a characteristic C9 represents the relationship between the pressure and the concentration of the material H in the carrier gas when the material H was heated at 430° C. and, likewise, characteristics C10 and C11 represent the characteristics when the material H was heated at 440° C. and 460° C., respectively. Herein, given that the concentration on the axis of ordinates is y and (1/P) of the lower scale of the axis of abscissas is x in FIG. 10, the characteristic C9 can be approximated by a straight line of y=16.991x−0.0264 and, likewise, the characteristics C10 and C11 can be approximated by straight lines of y=24.943x+0.1053 and y=59.833x+0.0314, respectively. With respect to any of the temperatures, a y-intercept is small in each straight line representing the characteristic and thus each straight line is considered to represent a proportional relationship between x and y.

Figure 11:
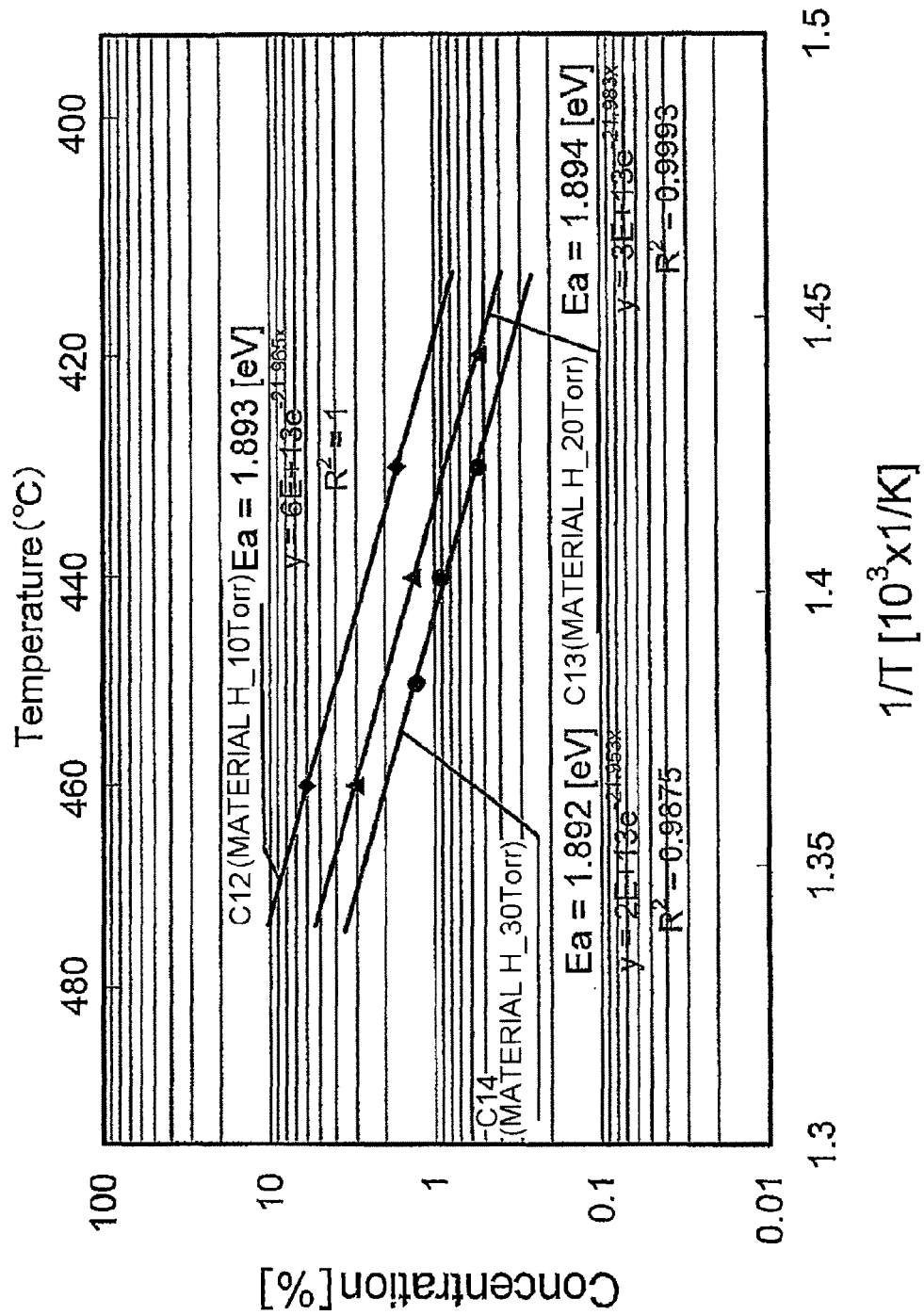
FIG. 11 is a diagram showing, like FIG. 10, the characteristics when a material according to this invention was used, wherein the temperature dependence of the concentration of an organic EL raw material (material H) in a carrier gas is shown in relation to pressure.

Herein, when the logarithms of the concentrations y in FIG. 10 are plotted against an inverse number of an absolute temperature $(1/T)(10^3 \times 1/K)$, characteristics C12, C13, and C14 in FIG. 11 are obtained. Herein, the characteristic C12 shows the plotted results at 10 Torr and, likewise, the characteristics C13 and C14 show the plotted results at 20 Torr and 30 Torr, respectively. From FIG. 11, it is seen that, in the x-y plane, the slopes of the graphs each representing the relationship between x and y are substantially constant regardless of the pressure. Further, the characteristics C12, C13, and C14 can be approximated by $y=6E+13e^{-21.965x}$, $y=3E+13e^{-21.983x}$, and $y=2E+13e^{-21.953x}$, respectively. Herein, x is a value of 1/T expressed by the absolute temperature.

From the above formulas and the characteristics C12 to C14, the slopes of the characteristics C12 to C14 represent activation energies Ea in constant pressure states of 10 Torr, 20 Torr, and 30 Torr, respectively, and values thereof are 1.893 eV, 1.894 eV, and 1.892 eV, respectively.

On the other hand, the evaporation rate of the material H, i.e. the concentration of the material H, can be represented by the following formula (1).

$$V (\%) = (Ko/P) \times e^{-Ea/kT} \quad (1)$$

where Ko is a constant (%·Torr), P is a pressure (Torr), k is a Boltzmann constant ($=8.617 \times 10^{-5}$ eV/K), and Ea is an activation energy (eV). Since the material H concentrations given by the formula (1) should be equal to the formulas derived from FIG. 11, i.e. $y=6E+13e^{-21.965x}$, $y=3E+13e^{-21.983x}$, and $y=2E+13e^{-21.953x}$, the constant Ko can be derived from the formula (1) and the formulas obtained from FIG. 11 by giving the temperatures and the material H concentrations. In other words, the evaporation characteristic of the material H can be defined by these parameters Ea and Ko.

Tables 1, 2, and 3 show material H concentrations in 10 cc/min at pressures of 10, 20, and 30 Torr, respectively, and values of Ko.

TABLE 1

Material H Concentration in 10 cc/min at a pressure of 10 Torr

| Temperature | Material H Concentration | K (Constant) Value |
|---|---|---|
| 430° C. | 1.68% | $5.903 \times 10^{14}$ (% ■ Torr) |
| 460° C. | 6.01% | $5.908 \times 10^{14}$ (% ■ Torr) |
| 000° C. | 0.00% | $0.000 \times 10^{14}$ (% ■ Torr) |

TABLE 2

Material H Concentration in 10 cc/min at a pressure of 20 Torr

| Temperature | Material H Concentration | K (Constant) Value |
|---|---|---|
| 420° C. | 0.54% | $5.968 \times 10^{14}$ (% ■ Torr) |
| 440° C. | 1.37% | $6.220 \times 10^{14}$ (% ■ Torr) |
| 460° C. | 3.05% | $5.992 \times 10^{14}$ (% ■ Torr) |

TABLE 3

Material H Concentration in 10 cc/min at a pressure of 30 Torr

| Temperature | Material H Concentration | K (Constant) Value |
|---|---|---|
| 430° C. | 0.54% | $5.708 \times 10^{14}$ (% ■ Torr) |
| 440° C. | 0.91% | $6.211 \times 10^{14}$ (% ■ Torr) |
| 450° C. | 1.28% | $5.710 \times 10^{14}$ (% ■ Torr) |

The constant Ko of the material H is derived in Tables 1 to 3. When a material is unknown, if a measured value of the concentration at a particular temperature is obtained and further an activation energy Ea is obtained from the temperature dependence of the organic EL raw material concentration like that shown in FIG. 11, a value of the constant Ko is determined and, by comparing this value with Tables 1 to 3, the unknown material can be identified as the material H.

Likewise, the same evaluation as that of the material H was also carried out for an organic EL raw material known as a material C. As a result of this, the results similar to those on the material H were obtained.

Figure 12:
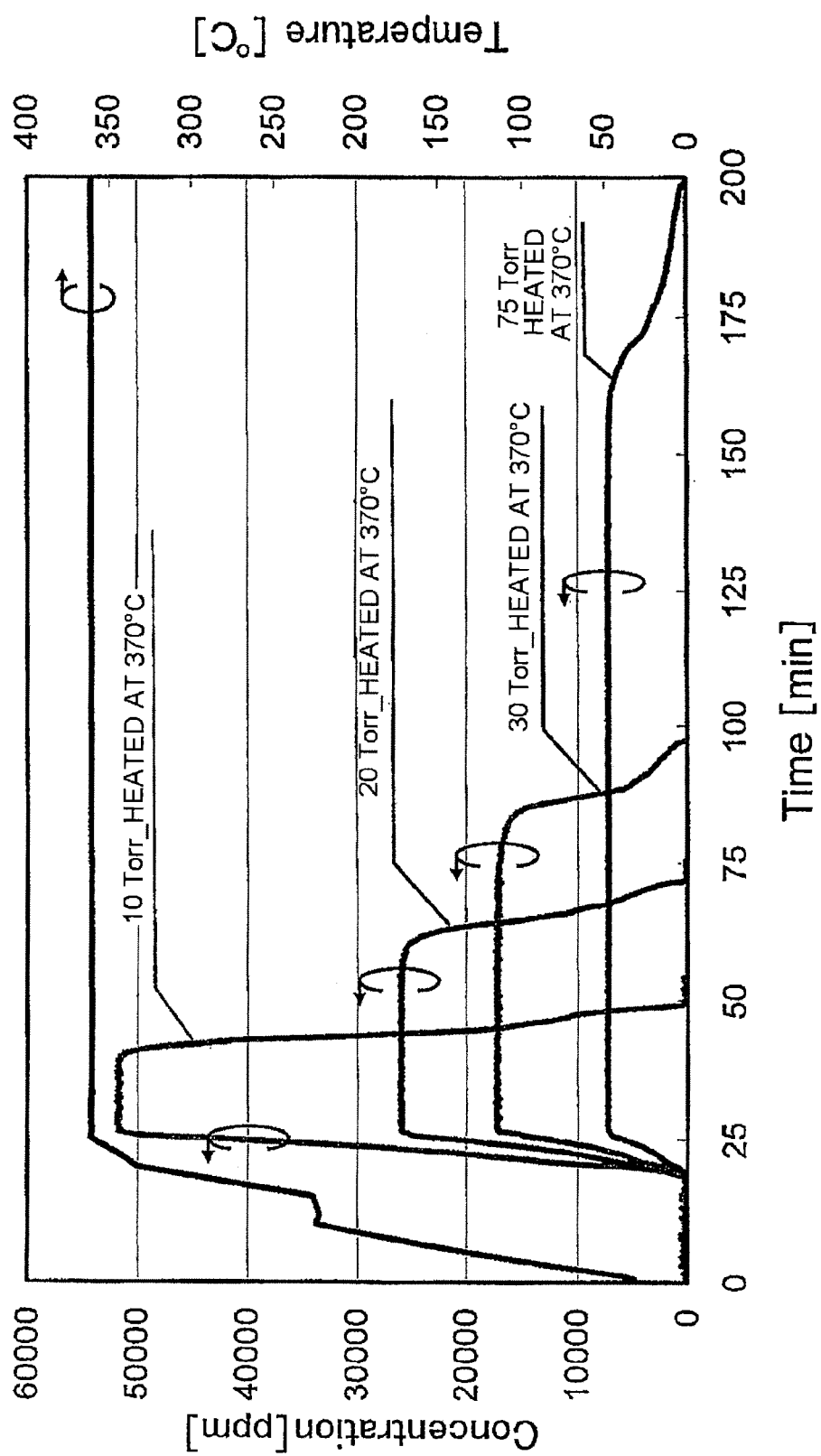
FIG. 12 is a diagram showing the pressure dependence of evaporation behavior of an organic EL raw material (material C) according to this invention, wherein there is shown the pressure dependence in the state where the temperature is kept constant.

That is, referring to FIG. 12, there are shown the results of measuring time-dependent changes of the material C concentration in a carrier gas in the state where evaporating dishes are heated at 370° C. As is also clear from FIG. 12, when the material C is heated at 370° C. and the pressure is changed, it is possible to increase the material C concentration in the carrier gas as the pressure decreases and, further, the material C concentration is substantially constant. That is, in the state of being maintained at 370° C. and 75 Torr, a concentration of about 8000 ppm can be maintained over a long period of time. Subsequently, as the pressure is reduced to 30 Torr, 20 Torr, and 10 Torr, the material C concentration in the carrier gas increases and, further, the time of high concentration is shortened. This means that a material C film can be quickly deposited by reducing the pressure.

Likewise, even by changing the pressure in the state of being heated at 330° C. and 350° C., the results similar to those in FIG. 12 were obtained. Further, when the temperature was changed in the range of 430° C. to 450° C. in the state where the pressure was maintained constant (e.g. at 30 Torr), the results similar to those in FIG. 8 for the material H were also obtained for the material C.

Figure 13:
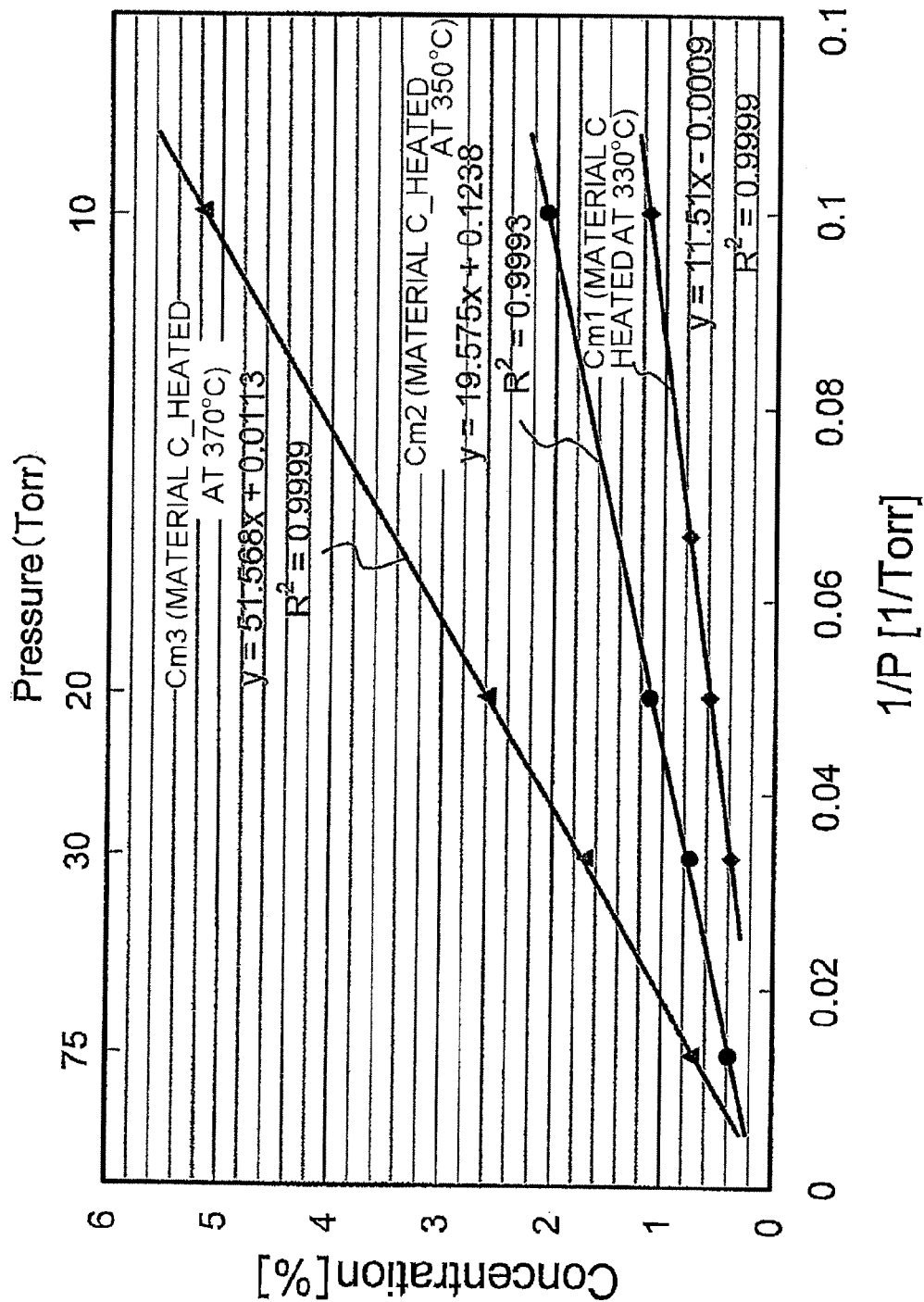
FIG. 13 is a diagram showing the characteristics of a material according to this invention, wherein the pressure dependence of the concentration of an organic EL raw material (material C) in a carrier gas is shown in relation to temperature.

Taking this into account, the relationship between pressure and concentration in the state where the temperature of the material C was maintained constant was measured, then, as shown in FIG. 13, there were obtained characteristics Cm1, Cm2, and Cm3 representing the relationships between concentration and pressure at temperatures of 330° C., 350° C., and 370° C., respectively. The characteristics Cm1 to Cm3 can be approximated by y=11.51x−0.0009, y=19.575x+0.1238, and y=51.568x+0.0113, respectively. Also with respect to the material C, y-intercepts of Cm1 to Cm3 are all small and thus it can be said that x and y are in a proportional relationship.

Further, like in FIG. 11 relating to the material H, the relationships between concentration and temperature (1/T)

Figure 14:
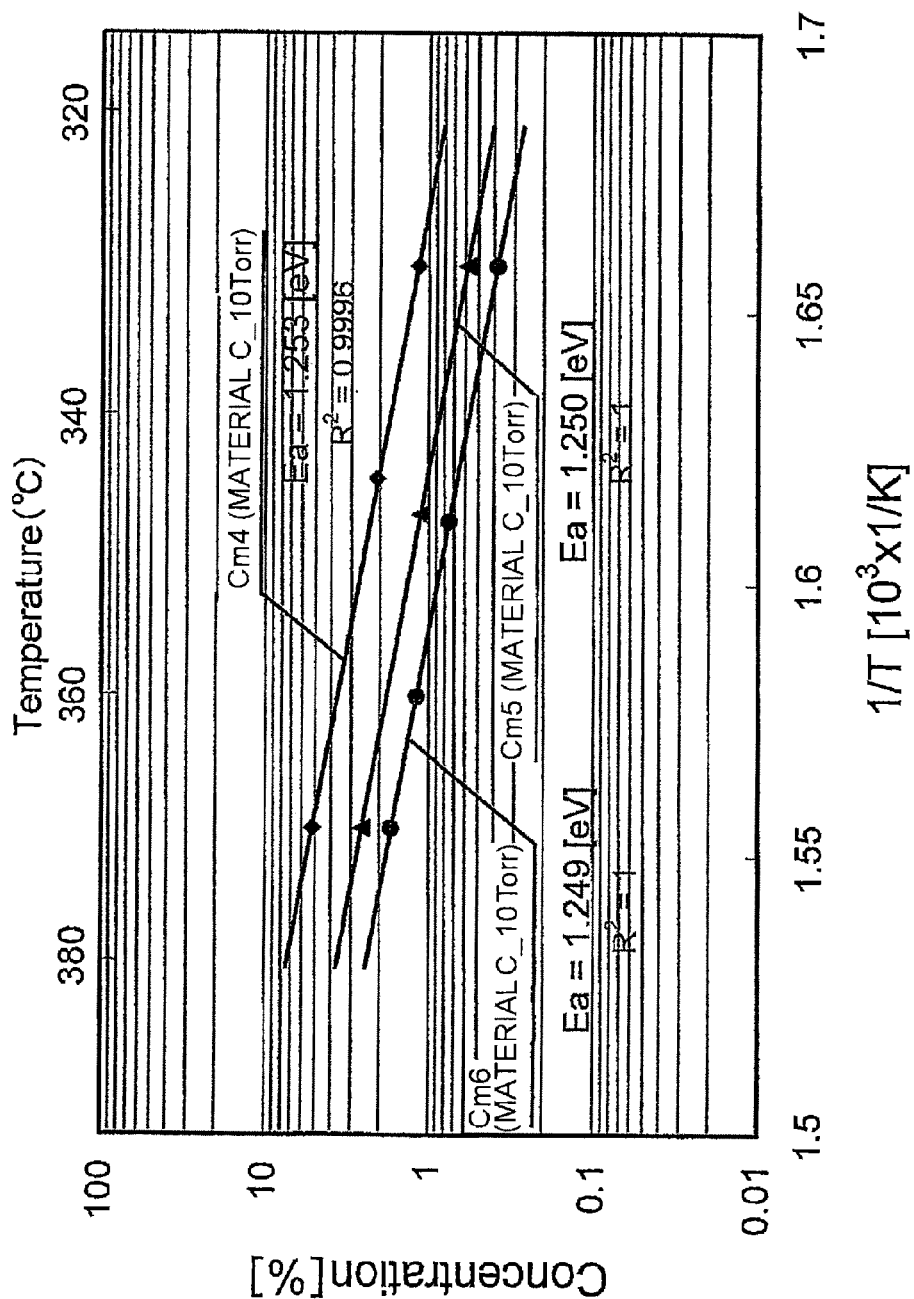
FIG. 14 is a diagram showing, like FIG. 13, the characteristics of a raw material according to this invention, wherein the temperature dependence of the concentration of an organic EL raw material (material C) in a carrier gas is shown in relation to pressure.

($10^3 \times 1/K$) at respective pressures of 10 Torr, 20 Torr, and 30 Torr, while each pressure was maintained constant, were also derived for the material C. Then, characteristics Cm4, Cm5, and Cm6 as shown in FIG. 14 were obtained for the respective pressures of 10 Torr, 20 Torr, and 30 Torr. Like in the case of the material H, it can be said that the slopes of Cm4 to Cm6 in the x-y plane are substantially constant regardless of the pressure. When activation energies Ea are derived from the characteristics Cm4, Cm5, and Cm6 at the pressures of 10, 20, and 30 Torr, there are obtained 1.253 (eV), 1.250 (eV), and 1.249 (eV), respectively.

On the other hand, using the formula (1), the constant Ko is derived from the temperatures and the material C concentrations at the pressure of 10 Torr, which is as shown in Table 4. Further, the constant Ko is derived from the temperatures and the material C concentrations at the pressures of 20 Torr and 30 Torr, which is as shown in Tables 5 and 6.

TABLE 4

Material C Concentration in 10 cc/min at a pressure of 10 Torr

| Temperature | Material C Concentration | K (Constant) Value |
| --- | --- | --- |
| 330°C | 1.15% | $3.235 \times 10^{11}$ (%·Torr) |
| 350°C | 2.05% | $2.670 \times 10^{11}$ (%·Torr) |
| 370°C | 5.15% | $3.232 \times 10^{11}$ (%·Torr) |

TABLE 5

Material C Concentration in 10 cc/min at a pressure of 20 Torr

| Temperature | Material C Concentration | K (Constant) Value |
| --- | --- | --- |
| 330° C. | 0.58% | $3.111 \times 10^{11}$ (%·Torr) |
| 350° C. | 1.12% | $2.779 \times 10^{11}$ (%·Torr) |
| 370° C. | 2.59% | $3.120 \times 10^{11}$ (%·Torr) |

TABLE 6

Material C Concentration in 10 cc/min at a pressure of 30 Torr

| Temperature | Material C Concentration | K (Constant) Value |
| --- | --- | --- |
| 330° C. | 0.38% | $3.635 \times 10^{11}$ (%·Torr) |
| 350° C. | 0.75% | $3.301 \times 10^{11}$ (%·Torr) |
| 370° C. | 1.70% | $3.513 \times 10^{11}$ (%·Torr) |

This means that when the temperature, the concentration, and the pressure are known, the constant Ko of the formula (1) determining the evaporation rate can be derived and it is possible to identify a material based on the Ko value. In other words, this means that when the temperature is set to 250 to 500° C. enabling efficient evaporation and gas supply control, preferably 300 to 450° C., the concentration is set to 0.1 to 10% enabling efficient film formation, and the pressure is set to $10^{-3}$ Torr or more, a material having an Ea value and a constant Ko satisfying the formula (1) determining the evaporation rate can be practically used for film formation by carrier gas transport.

As is also clear from a comparison between Tables 1 to 3 and Tables 4 to 6, the material H and the material C largely differ from each other in value of Ko. That is, while the Ko values of the material H are on the order of $10^{14}$, the Ko values of the material C are on the order of $10^{11}$. Since a Ko value is conjectured to have a value unique to a material, it is possible to identify various materials based on Ko values thereof.

That is, the Ko values of the material H in the range of 10 Torr to 30 Torr are distributed in the range of $5.710 \times 10^{14}$ (%·Torr) to $6.211 \times 10^{14}$ (%·Torr) as shown in Tables 1 to 3. On the other hand, the Ko values of the material C in the range of 10 Torr to 30 Torr are distributed in the range of $2.670 \times 10^{11}$ (%·Torr) to $3.635 \times 10^{11}$ (%·Torr) as shown in Tables 4 to 6.

Likewise, various materials other than the material H and the material C can be identified by Ko values. In this manner, one feature of this invention is to identify a material by a Ko value.

Further, if parameters Ea and Ko of an organic EL raw material are obtained, it is possible to determine the manufacturing conditions using the formula (1). Specifically, in general, when manufacturing organic EL devices, there are various restrictions to the film-forming conditions for film formation of an organic EL raw material. For example, if the manufacturing volume per unit time is determined, the film-forming time of one film is determined and, as a result, the concentration of the organic EL raw material in a carrier gas is determined. Further, when the organic EL raw material is determined, since it is necessary to evaporate it without decomposition, the heating temperature is also restricted. Since there is a limit to an achievable degree of vacuum due to the performance of a manufacturing apparatus, it is considered that the pressure in evaporation means may also be restricted.

In the case where the film-forming condition is restricted as described above, it is possible to determine the restricted film-forming condition within the restriction and then to determine other conditions from the determined film-forming condition and the formula (1).

To give one example, in the case where the lower limit of concentration is determined from the production volume and the upper limit of evaporation temperature is determined from the characteristics of an organic EL raw material, a necessary pressure value can be obtained by determining the concentration and the temperature within the restrictions, respectively, substituting them into the formula (1), and solving it.

Industrial Applicability

According to this invention, it is possible to provide a film-forming material suitable for film formation using a carrier gas. Further, according to this invention, it is possible to derive from experimental data a parameter that defines a characteristic of an organic EL raw material and to predict an organic EL raw material based on this parameter and, therefore, it is quite effective for experiments and studies of organic EL raw materials. Further, using this parameter, it is possible to determine the conditions for manufacturing organic EL devices. This invention is not merely limited to the organic EL raw materials, but can be applied to various film-forming materials.

The invention claimed is:

1. A film forming method for evaporating a film-forming material in evaporation means and transporting said evaporated film-forming material to the vicinity of a substrate by a carrier gas, thereby forming a film on said substrate, the film-forming material having undefined parameters, said film forming method comprising:

selecting, as the undefined parameters of the film-forming material, activation energy Ea and a constant Ko concerned with an evaporation rate V;

determining the activation energy Ea of the film-forming material from a relationship between a concentration and a temperature, where Ea is expressed by eV;

determining the constant Ko of the film-forming material by measuring a concentration of the film-forming material at a temperature with a pressure kept constant where Ko is expressed by %·Torr;

determining values of two of P, T, and V, given that a pressure on said substrate is P, an absolute temperature for evaporating said film-forming material is T, and a concentration of said film-forming material in said carrier gas is V; and controlling a remaining one of P, T, and V in accordance with a formula concerned with the evaporation rate V:

$$V=(Ko/P) \times e^{-Ea/kT},$$

wherein V is the concentration expressed by %, P is the pressure expressed by Torr, and k is a Boltzmann constant; and wherein the pressure P is lower than an atmospheric pressure;

wherein the film of the film-forming material is formed on the substrate in accordance with the determined and controlled P, T, and V.

2. The film forming method claimed in claim 1, wherein the concentration V and the absolute temperature T are determined and thereafter, the pressure P is calculated.

3. The film forming method claimed in claim 1, wherein the film-forming material is an organic EL raw material.

4. The film forming method claimed in claim 1, further comprising:

setting the temperature T between 250° C. and 500° C., the concentration V between 0.1 and 10%, and the pressure P between $10^{-3}$ Torr and 30 Torr.

* * * * *